United States Patent [19]

Carver

[11] Patent Number: 4,484,150
[45] Date of Patent: Nov. 20, 1984

[54] HIGH EFFICIENCY, LIGHT WEIGHT AUDIO AMPLIFIER AND POWER SUPPLY

[76] Inventor: Robert W. Carver, 330 Avenue A, Snohomish, Wash. 92890

[21] Appl. No.: 413,876

[22] Filed: Sep. 1, 1982

Related U.S. Application Data

[63] Continuation of Ser. No. 261,238, Jun. 27, 1980, abandoned.

[51] Int. Cl.³ ............................................. H03F 1/02
[52] U.S. Cl. .................................. 330/297; 330/265; 330/268
[58] Field of Search ............... 330/265, 268, 273, 274, 330/296, 297, 298, 295, 207 P; 363/86

[56] References Cited

U.S. PATENT DOCUMENTS

| | | | |
|---|---|---|---|
| 3,319,175 | 5/1967 | Dryden | 330/297 |
| 3,376,388 | 4/1968 | Reiffin | 330/265 X |
| 3,426,290 | 2/1969 | Jensen | 330/297 |
| 3,466,527 | 9/1969 | Chun | 363/52 |
| 3,470,444 | 9/1969 | Bixby | 320/22 X |
| 3,483,425 | 12/1969 | Yanishevsky | 330/265 X |
| 3,486,128 | 12/1969 | Lohrmann | 330/285 |
| 3,506,905 | 4/1970 | Thomas | |
| 3,542,953 | 11/1970 | Munch, Jr. | 330/295 X |

(List continued on next page.)

FOREIGN PATENT DOCUMENTS

| | | |
|---|---|---|
| 1167917 | 4/1964 | Fed. Rep. of Germany . |
| 2137567 | 2/1972 | Fed. Rep. of Germany . |
| 2217781 | 1/1974 | Fed. Rep. of Germany . |
| 2423098 | 12/1974 | Fed. Rep. of Germany . |
| 2647916 | 5/1977 | Fed. Rep. of Germany . |
| 2705604 | 8/1977 | Fed. Rep. of Germany . |
| 2376555 | 12/1976 | France . |
| 59451 | 5/1974 | Japan . |
| 141743 | 5/1974 | Japan . |
| 45550 | 4/1975 | Japan . |
| 44857 | 4/1976 | Japan . |
| 119149 | 10/1977 | Japan . |
| 119150 | 10/1977 | Japan . |
| 53-7160 | 3/1978 | Japan . |

OTHER PUBLICATIONS

Walker, "SCR Power Supplies", *Electronics World*, Oct., 1971, pp. 36-38, 62.
Miura et al., "New Power Supply for Audio Power Amplifiers," *IEEE Transactions on Consumer Electronics*, vol. CE-24, No. 3, Aug. 1978, pp. 291-299.
New York, U.S.A., F. E. Muller: "Interference Elimination in Switching, Regulated Power Supplies" Fig. 1, p. 28, left-hand column, paragraph Switching Regulation Principles, line 1-right hand column, line 10.

*Primary Examiner*—James B. Mullins
*Attorney, Agent, or Firm*—Hughes, Barnard & Cassidy

[57] ABSTRACT

The present invention comprises an amplifier circuit (2, 1100, 1500, 1600) and transformer based power supply (24, 500, 700, 1710) wherein greater efficiency is achieved by using the input signal characteristics to control various aspects of the circuit operation. The transformer primary winding (8, 500a, 700a, 1710a) is energized by a pulsed power supply (6, 502, 702, 1702) which is duty cycle modulated in response to the signal being amplified. One embodiment of the amplifier employs output transistors (Q1101, Q1103, Q1105, Q1107, Q1109, Q1111) connected to respective stepped voltage levels. Amplifier control circuitry (1126, 1130, 1138, 1140) acts in relation to the input signal amplitude to more evenly distribute the voltage drop across the interconnected transistors (Q1101, Q1103, Q1105, Q1107, Q1111), thus reducing amplifier power requirements and minimizing distortion in the amplifier output. In another embodiment, a stereo amplifier constructed in accordance with the present invention contains a network (1602) for inverting the audio signals received by a first amplifier input channel (1600). The inverted signals are thereafter processed in out-of-phase relationship to the signals in the second amplifier input channel (1500) to more efficiently utilize the power supply. In yet another embodiment, the power supply (1710) itself is constructed with a number of fault detecting circuits which sense fault conditions in either the power supply or the amplifier and shut the power off accordingly.

20 Claims, 29 Drawing Figures

U.S. PATENT DOCUMENTS

| | | | |
|---|---|---|---|
| 3,622,899 | 5/1969 | Eisenberg | 330/263 |
| 3,723,849 | 3/1973 | Ludloff et al. | 315/223 X |
| 3,725,676 | 4/1973 | Melchior | 307/296 X |
| 3,772,606 | 11/1973 | Waehner | 330/267 |
| 3,858,119 | 12/1974 | Engelhardt | 330/273 |
| 3,887,878 | 5/1975 | Schade, Jr. | 330/267 |
| 3,896,369 | 7/1975 | Nakata | 307/310 X |
| 3,947,754 | 3/1976 | Wechsler | 318/227 X |
| 3,961,280 | 6/1976 | Sampei | 330/267 |
| 4,008,416 | 2/1977 | Nakasone | 315/194 |
| 4,021,684 | 5/1977 | Macey | 330/265 X |
| 4,028,609 | 6/1977 | Detering | 307/264 X |
| 4,051,425 | 9/1977 | Smith | 363/86 |
| 4,054,843 | 10/1977 | Hamada | 330/297 X |
| 4,087,850 | 5/1978 | Kuizumi | 363/21 |
| 4,100,501 | 8/1978 | Nakagaki et al. | 330/263 |
| 4,115,742 | 9/1978 | Yokoyama | 330/297 |
| 4,118,768 | 10/1978 | Wilson, Sr. | 363/85 |
| 4,152,607 | 5/1979 | Nakasone | 315/194 X |

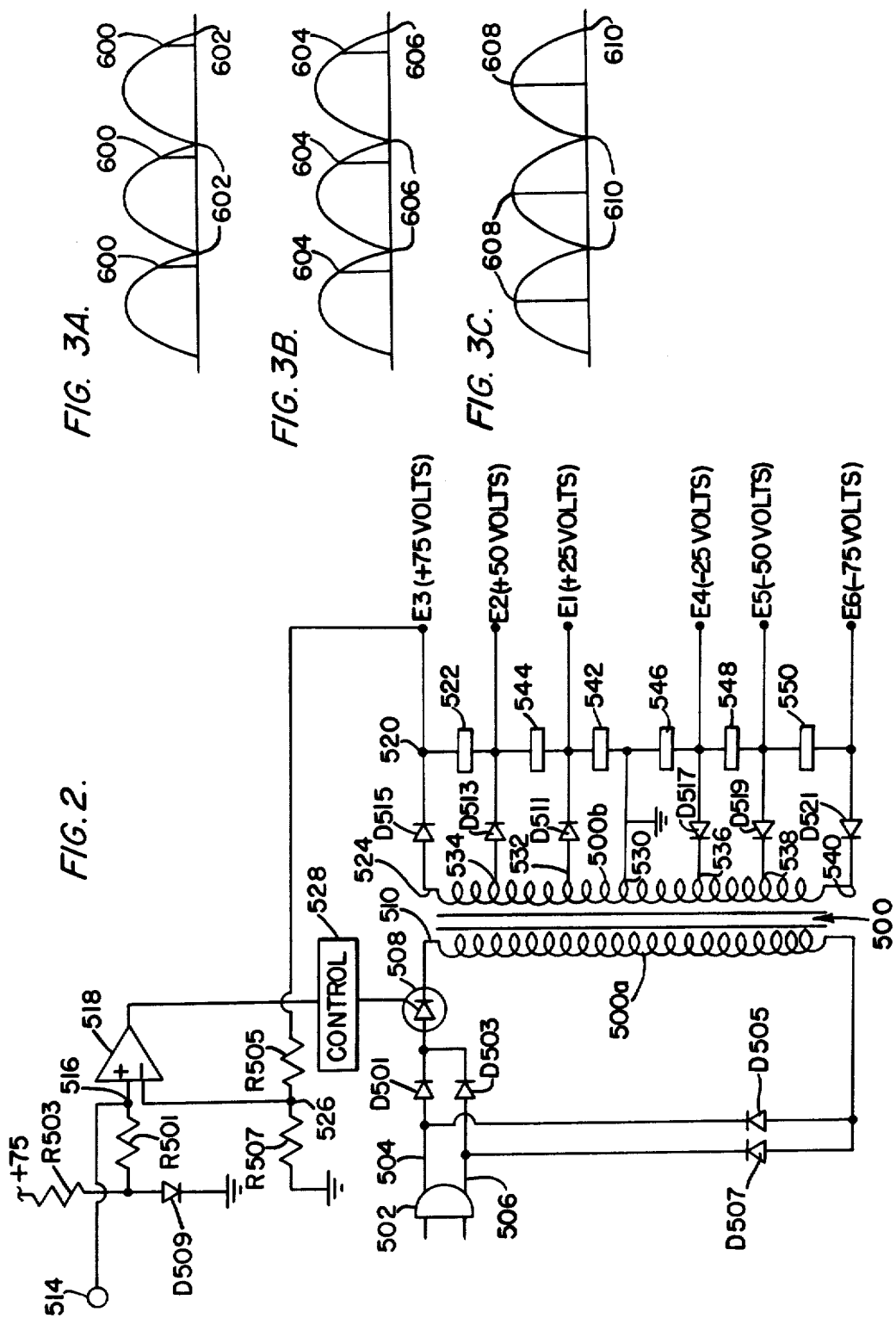

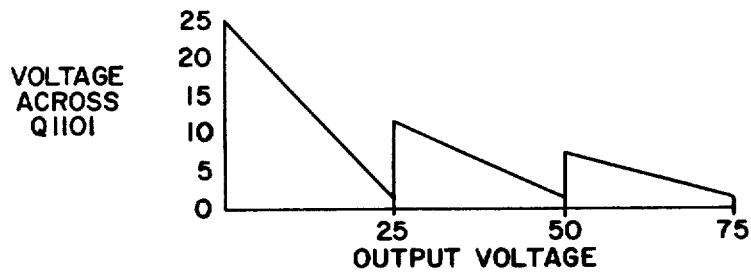
FIG. 9A. VOLTAGE ACROSS Q1101
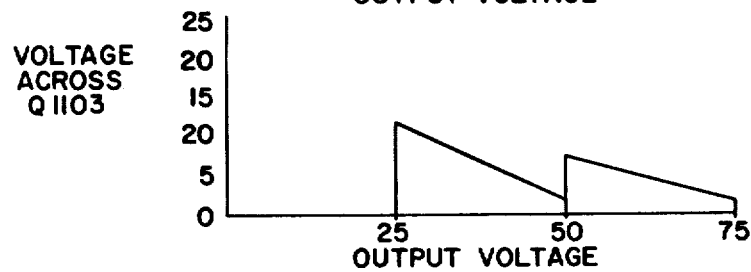
FIG. 9B. VOLTAGE ACROSS Q1103
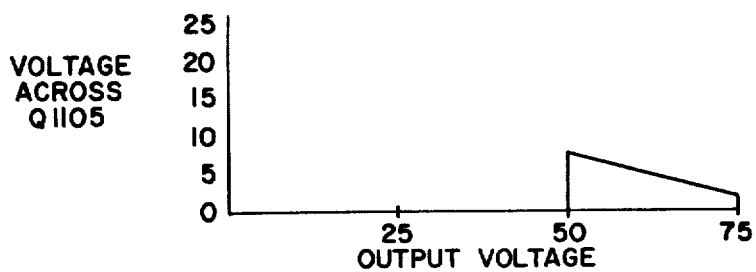
FIG. 9C. VOLTAGE ACROSS Q1105
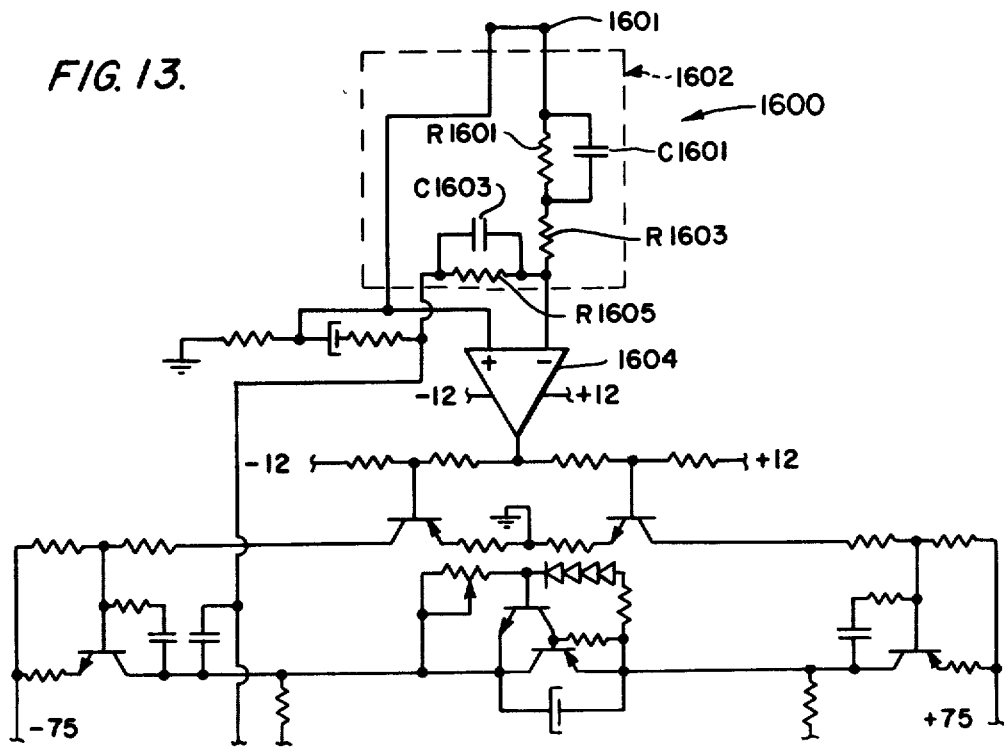
FIG. 13.

HIGH EFFICIENCY, LIGHT WEIGHT AUDIO AMPLIFIER AND POWER SUPPLY

This application is a continuation of application Ser. No. 261,238, filed June 27, 1980, now abandoned.

DESCRIPTION

TECHNICAL FIELD

This invention relates to methods for audio signal amplification and to audio amplifier circuitry and power supplies therefor.

BACKGROUND ART

Solid state circuit components have brought incredible reduction in the size, weight and cost of audio amplifier circuitry and have also achieved increased fidelity in sound reproduction as compared with vacuum tube technology of a prior-generation. In an attempt to exploit to the limit the potential of solid state circuitry, audio engineers have striven to provide the user with increased power ratings while simultaneously achieving decreased distortion levels. Their efforts have met with resounding success, but have produced some undesirable side effects primarily in the areas of increased weight, cost and power consumption. For example, a commercially available state-of-the art 400 watt amplifier typically weighs anywhere from 16 kg to over 38 kg depending upon the particular design and choice of materials. Such amplifiers normally employ costly components necessitated by the peak loads which they must carry, and generate significant amounts of heat which must be dissipated to avoid component damage.

With regard to the transformer weight problem an obvious approach would be to reduce the number of windings and/or the gauge of the wire making up the transformer coils. However, reduction in the number of windings also reduces the inductance in the primary coil, thereby increasing idling currents through the coil and contributing to both heat generation and increased power consumption. The conventional method for achieving low idling currents in the primary has been to use a large number of windings. This approach also requires a large number of windings in the secondary to keep the voltage in the secondary at the proper level. The other obvious alternative for weight reduction, i.e. reduction in the wire gauge, is not an acceptable solution since the internal resistance of each coil would be increased, leading to excessive heat generation and power loss upon high power demands being placed on the transformer. Conventional wisdom has thus taught the necessity of increasing the size and weight of the transformer whenever a transformer powered amplifier is redesigned for increased power rating.

An alternative approach for reducing the overall weight, size and cost of audio amplifiers has been to reduce the total input power requirement without decreasing output power capability. Such increases in amplifier efficiency permit the use of less costly, lower weight power supplies, and can be achieved by reducing the power dissipation which normally attends the conventional use of output transistors in the output stage of the amplifier. When such power dissipation decreases are achieved, additional weight and cost savings are realized beyond those realized in the power supply since the weight, size and cost of the heat sinks normally required by the output transistors in the amplifier may also be reduced.

U.S. Pat. No. 3,426,290 to Jensen is representative of one known approach for increasing amplifier efficiency by keeping the voltage supplied to the output transistor of the amplifier very close to the output voltage level, thereby permitting operation of the output transistor in a condition which is at all times only slightly out of saturation. When operated in this condition, the actual voltage drop across the output transistor will be maintained quite low and the power dissipated by the transistor (equal to voltage across the transistor X current through the transistor) will be correspondingly reduced. A rather complex regulator is employed in the Jensen circuit to maintain the desired voltage supply to the output transistor wherein energy is stored in an inductive capacitive circuit by means of a switching transistor operated at high speed in response to a control signal derived from the audio input signal. By operating the switching transistor in full "on" or full "off" condition to maintain the desired voltage supply to the amplifier output transistor, energy consumption by the combined regulator and output transistor is reduced over that which would be consumed by an output transistor operated with a conventional fixed supply voltage. While producing a decided advantage in amplifier efficiency, the Jensen circuit is only truly effective if the switching transistor is operated at high frequencies, which can in turn cause transient interference distortion in the amplifier output signal. U.S. Pat. No. 4,054,843 to Hanada discloses a similar circuit to that disclosed in Jensen.

An alternative approach to achieving improved amplifier efficiency is disclosed in the patent to Dryden (U.S. Pat. No. 3,319,175) which discloses a stepped voltage supply operated in response to the voltage level of the amplifier output whereby the minimum voltage from the available power supply voltages sufficient to achieve the desired amplification is applied across the power amplifying element. While useful for the purposes disclosed, Dryden employs only a single transistor as the power amplifying element for each polarity of the output voltage and thus the entire difference between the load voltage and the connected supply voltage appears across the output transistor. Significant power losses will thus occur unless a large number of discrete supply voltages are provided by the power supply circuitry. Each such discrete voltage requires a separate amplitude comparator and associated switching device thus adding significantly to the cost of the power supply.

Still another approach disclosed in the prior art is illustrated in U.S. Pat. No. 3,622,899 to Elsenberg. In this patent a low power dissipation amplifier circuit is disclosed including plural transistors coupled in series to a load terminal wherein the transistors are energized by respective voltage sources having different magnitudes and wherein the transistors are biased to operate as amplifiers in sequence in response to an input signal of increasing magnitude. This type of circuit causes each output transistor to be driven into saturation as the next higher voltage output transistor is brought into operation, causing substantially the entire voltage drop in the amplifier output stage (that is the difference between the supply voltage and the load or output voltage) to appear across only a single output transistor at any one time. This arrangement of circuitry requires output transistors having substantial power ratings unless a relatively large number of output transistors and discrete supply voltages are provided. Either approach will add to amplifier cost. The patents to Woehner (U.S. Pat. No. 3,772,606) and to Sampei et al. (U.S. Pat. No. 3,961,280) disclose circuit arrangements similar to that described above with reference to the Elsenberg patent.

The patent to Schade, Jr. (U.S. Pat. No. 3,887,878) discloses a transistor series amplifier wherein plural series connected transistors in the output stage are biased to share the total voltage drop in the output stage to permit use of lower cost components. However, this patent fails to disclose a technique for reducing the total power dissipation in such transistors.

Still other techniques for reducing the cost of amplifier power supplies have been disclosed in the prior art. For example in the U.S. patent to Munch, Jr. (U.S. Pat. No. 3,542,953) a technique is disclosed wherein a single power supply may serve two Class B amplifier circuits designed to amplify the same audio signal by phase inverting the input to one amplifier to cause the amplifiers to draw peak current from the power supply in alternation. Munch, Jr. does not, however, suggest how such a technique can be employed in a system employing dual amplifiers (such as in a sterophonic system) for amplifying two separate signals.

None of the prior art systems discussed above addresses directly the problem of reducing power supply weight and costs by modifying the supply itself in a manner to employ less costly lighter, weight components while maintaining the power supply capabilities required by the amplifier circuit.

The patent to Chun (U.S. Pat. No. 3,466,527) discloses a circuit for reducing the cost and size of a transformer based voltage supply circuit including a duty cycle controlled switch in the A.C. power supply circuit of the transformer primary. The switch functions to regulate output voltage from the secondary. However, the lower cost and weight capability achieved by the concepts disclosed in Chun are derived by operating the duty cycle controlled switch over only a quarter cycle volt-time integral and do not in any way suggest how such a circuit design could be employed in an audio amplifier circuit in a manner to obtain power supply weight and cost reductions based on the characteristics of the incoming audio signals.

DISCLOSURE OF THE INVENTION

It is a general object of this invention to overcome the difficiencies of the prior art by providing an amplifier circuit and power supply of significantly reduced weight and cost achieved by simultaneously increasing the efficiency of the amplifier output stage and modulating the energization of the amplifier power supply in response to a characteristic of the signal being amplified.

Another object of this invention is to provide a transformer based power supply for an amplifier in which the transformer primary is energized by a pulsed supply which is duty cycle modulated partially in response to the signal being amplified. The duty cycle is controlled in a manner to insure that adequate power is available in the power supply output energized by the transformer secondary while at the same time minimizing the time during each cycle when idling currents are flowing through the primary winding of the transformer.

In one embodiment of the transformer based power supply of this invention, the primary of the transformer may be connected with a source of alternating current combined with a switch means arranged to cyclically interrupt the alternating current in response to a control signal produced by control means operatively connected to the switch means to cause the switch means to be conductive at selected portions of current cycles from the power input terminal means. The control means causes the switch means to be conductive for shorter periods of time for lower power requirements of the amplifying apparatus, and to be conductive for longer periods of time for higher power requirements of the amplifying apparatus. Desirably, the control means causes the switch means to be conductive during a latter portion of each current pulse from said power input terminal. In one embodiment, there is a rectifying means operatively connected with the power input terminal means and the primary winding to cause only positive current pulses to be directed to the primary winding. The switch means comprises voltage responsive switch means which becomes conductive at predetermined voltage levels of the current pulses. In the preferred form of this embodiment, the switch means comprises a silicon controlled rectifier connected in series between the power input terminal means and the primary winding of the transformer.

In another embodiment of the transformer based power supply, the power input terminal means is connected to the primary winding to cause alternating current to be delivered to the primary winding. The switch means is a voltage responsive means to cause the switch means to be conductive at predetermined voltage levels during latter portions of the current pulses. In the preferred form of this additional embodiment of the power supply, the switch means comprises a first triac connected in series with the primary winding. Operation of the first triac is governed by circuitry which responds to both the magnitude of the signal being amplified and the value of the voltage output from the transformer secondary. The triac is caused to fire during precisely defined portions of the duty cycle, thereby regulating the amount of current flow through the transformer primary and the corresponding transfer of energy to the transformer secondary.

In another form of the transformer based power supply, the triac switching means discussed above further includes cut off circuitry for shutting off current flow through the primary of the transformer before the normal waveform of the alternating current supply has returned to zero. Such cut off circuitry may include a second triac which operates to commutate the first triac into a non-conductive state.

In the method of the present invention, a series of current pulses are directed through a primary winding of a transformer to cause voltage pulses to be imposed on a secondary winding of the transformer. These voltage pulses are in turn transmitted to power input terminals of an amplifier means. The method further comprises controlling power of the pulses transmitted to the primary winding to increase and decrease power of the pulses as the signal increases and decreases in amplitude. In this manner, power delivered to the amplifier means is matched to the power requirements of the amplifier means, thus providing an output corresponding to the signals being amplified. Preferably, this is done by controlling the duration of the pulses delivered to the primary winding. A control signal is generated by comparing a first value related to amplitude of the signal and a second value related to power then available from the transformer.

With respect to one embodiment of the method, power is supplied to the amplifying apparatus at a relatively constant voltage. In one form of this method, there is transmitted a series of first direct current pulses through a primary winding of a transformer. The primary winding of the transformer is caused to be conductive at pre-selected time periods during latter portions of each pulse, so as to cause current pulses to flow through the primary winding and cause a magnetic field to build up around the transformer. While the magnetic field is building up, substantial current flow in the secondary winding of the transformer is prevented. The secondary winding of the transformer is caused to be conductive after each first current pulse in the primary winding, so as to cause second current pulses to flow in the secondary winding. These second current pulses are directed to power output terminal means. The first current pulses are controlled in response to power requirements at the output terminal means in a manner to cause first current pulses of greater power to flow during periods of higher power requirements at the output terminal means, and to cause first current pulses of lower power to flow during periods of lower power requirements of the output terminal means. Power of the first current pulses is controlled by utilizing a silicon controlled rectifier in series with the primary winding. The silicon controlled rectifier is made conductive at higher voltage levels when greater power is needed, and is made conductive at lower voltage levels when less power is needed.

In accordance with a second form of the method, power at a substantially constant voltage is supplied by means of alternating current pulses transmitted to the primary winding of the transformer. The primary winding of the transformer is caused to be conductive during latter portions of each half cycle of the pulses, so that positive and negative current pulses flow through the primary winding to cause corresponding positive and negative current pulses to flow through the secondary winding of the transformer. This form of the method further comprises rectifying the positive and negative current pulses from the transformer to transmit positive current to a positive output terminal and to transmit negative current pulses to a negative output terminal. Further, the period of conductivity for the primary winding are controlled in a manner such that the primary winding becomes conductive at higher and lower voltage levels of the alternating current pulses delivered to the transformer, thereby causing current pulses of greater or lesser power to be transmitted through the primary winding, in response to a power requirement of the output terminals. A triac may be utilized by connecting it in series with the primary winding. When used, the triac is caused to be conductive at higher voltage levels in response to greater power requirements at the output terminals, and to become conductive at lower voltage levels during periods of lower power requirements at the output terminals.

Still another object of this invention is to provide a high efficiency audio amplifier including series arranged transistors connected to respective stepped voltage levels wherein the transistors are controlled in a manner to more evenly distribute the voltage drop over the interconnected transistors, thus reducing power rating requirements and resulting in less distortion in the amplifier output.

In one embodiment of the audio amplifier, a plurality of series connected output transistors are connected in emitter follower configuration to the output of the amplifier. The transistor closest to the output is connected through its base to signal input means. The remaining transistors are controlled through their base electrodes by transistor control means designed to cause the series connected transistors to be non-conductive under conditions where said amplifying apparatus is amplifying a signal having an amplitude below a predetermined magnitude. The transistor control means causes the second transistor to become conductive under circumstances where the input signal is of a higher magnitude so that current at a higher voltage is delivered to the output terminal, with the result that current flows from the higher voltage point to the second and first transistors to the output terminal. In the preferred form, the transistor control means is responsive to output voltage from the first transistor to the load terminal. Further, the transistor control means is operatively connected to a base electrode of the second transistor in a manner that control current to the base electrode of the second transistor begins to flow when the output voltage reaches a predetermined voltage level, so as to cause the second transistor to be conductive and cause current to flow from the higher voltage point through said first and second transistors to the output terminal.

Desirably, the transistor control means is further characterized in that the first control means supplies base current to the base electrode of the second transistor according to a functional relationship of the output voltage at the output terminal. This is done in a manner that voltage of the current supplied to the base electrode of the second transistor varies as a function of magnitude of the output voltage, with the voltage of the base current to the second transistor being a voltage level intermediate the voltage at the higher voltage point and the output voltage, with the result that voltage drop across the second and first transistors is shared between the second and first transistors.

Specifically, the transistor control means comprises a control transistor having a first main current carrying electrode connected to the base electrode of the second transistor, and a second main current carrying electrode connected to voltage dividing means connected between said output terminal and a related higher voltage source. The base electrode of the control transistor is connected to a junction point between a pair of voltage dividing resistors, which in turn are connected between higher and lower voltage sources.

There is diode means inter-connecting the lower voltage point with the second electrode of the first transistor, so that when the signal voltage is at a level higher than a voltage level of the lower voltage point, the lower voltage point is blocked off from the higher voltage point.

In the preferred configuration, there are two sets of transistors arranged in push pull relationship, with at least two transistors being in each set. One set of transistors conducts during positive portions of the signal voltage, and the other set conducts during negative cycle portions of the signal voltage. The first set is connected to greater and lesser positive voltage points on the secondary winding of the transformer, while the other set of transistors is connected to greater and lesser negative voltage points on the secondary winding of the transistor. The first and second control means functions in substantially the same manner as indicated previously herein.

In the method of the present invention, a signal is amplified by directing the signal to a base electrode of a first transistor, having a first main current carrying electrode connected to a load terminal, and a second main current carrying electrode connected to a lower voltage source. Current is caused to flow from the lower voltage source through the first transistor during periods when amplitude of the signal is within a lower predetermined range.

During periods when the signal is within a higher predetermined range, a control current is directed to a base electrode of a second transistor. This second transistor has a first main current carrying electrode connected to the second main current carrying electrode of the first transistor, and a second main current carrying electrode connected to a higher voltage source.

Said method is further characterized in that the base current directed to the base electrode of the second transistor is at a voltage level intermediate a voltage at the higher voltage terminal and voltage at the load terminal. Thus, voltage drop across the second and first transistors is shared by the second and first transistors.

In still another embodiment of the subject invention, the audio amplifier includes a primary output transistor the base of which is responsive to the audio signal and the emitter collector circuit of which is connected between a first supply voltage and the amplifier output. Second and third transistors have their emitters connected through diodes to the collector of the first transistor and have their collectors connected, respectively, to second and third supply voltages which are higher than the first supply voltage. In this embodiment control circuit means are provided responsive to the amplifier output to cause the second and third transistors to sequentially commence conducting in response to the output voltage from the amplifier exceeding the first and second supply voltages, respectively. By this arrangement the voltage drop within the output stage of the amplifier occurs in one of the three ways as follows:

(a) solely across the first transistor,
(b) solely across the first and second transistors, or
(c) solely across the first and third transistors.

An additional feature of this invention is to provide a transformer based power supply circuit for an audio amplifier in which the transformer primary coil is energized by an A.C. current duty cycle modulated by a solid state switch which is, in turn, controlled by a phase shift network wherein the amount of phase shift is a function of the power supply output voltage and of the audio signal being amplified. The phase shift network may be connected by means of a light photon coupled communication link to control circuitry responsive to the output voltage of the power supply and a signal which tracks the audio signal being amplified. By this arrangement, the duty cycle of the A.C. signal applied to the transformer primary may be modulated to cause the amount of current flowing through the primary to be adjusted to be just sufficient to satisfy the power needs of the amplifier, thereby substantially reducing primary coil idling currents. In a preferred embodiment, the power supply circuit may be equipped with an automatic shut down capability in response to any one of the following conditions: over current or over voltage in the amplifier output or a direct current fault in the amplifier circuitry.

In yet another embodiment of this invention, the duty cycle controlled power supply circuit is desirably equipped with a transformer having a secondary to primary turns ratio below 1.0 with a primary induction above 30 millihenries and a coil wire gauge diameter above no. 18 when the transformer is used to produce approximately 1000, watts at a maximum ±75 volt D.C. output from conventional 117-125 volt, 60 cycle alternating current.

Still other and more specific objects of this invention will become apparent from a consideration of the following Brief Description of the Drawings and Best Mode for Carrying Out the Invention.

BRIEF DESCRIPTION OF THE DRAWINGS

FIG. 2 is a circuit diagram of a stepped voltage power supply constructed in accordance with the present invention;

FIGS. 3A, 3B and 3C illustrate various current cycle waveforms flowing through the primary winding of the power supply of FIG. 2;

FIGS. 9A, 9B and 9C are diagrams of the voltage drops across the push-pull transistors employed in the amplifier of FIG. 8;

FIG. 13 illustrates a portion of the right channel of an amplifier constructed in accordance with the present invention.

BEST MODE FOR CARRYING OUT THE INVENTION

Figure 1:
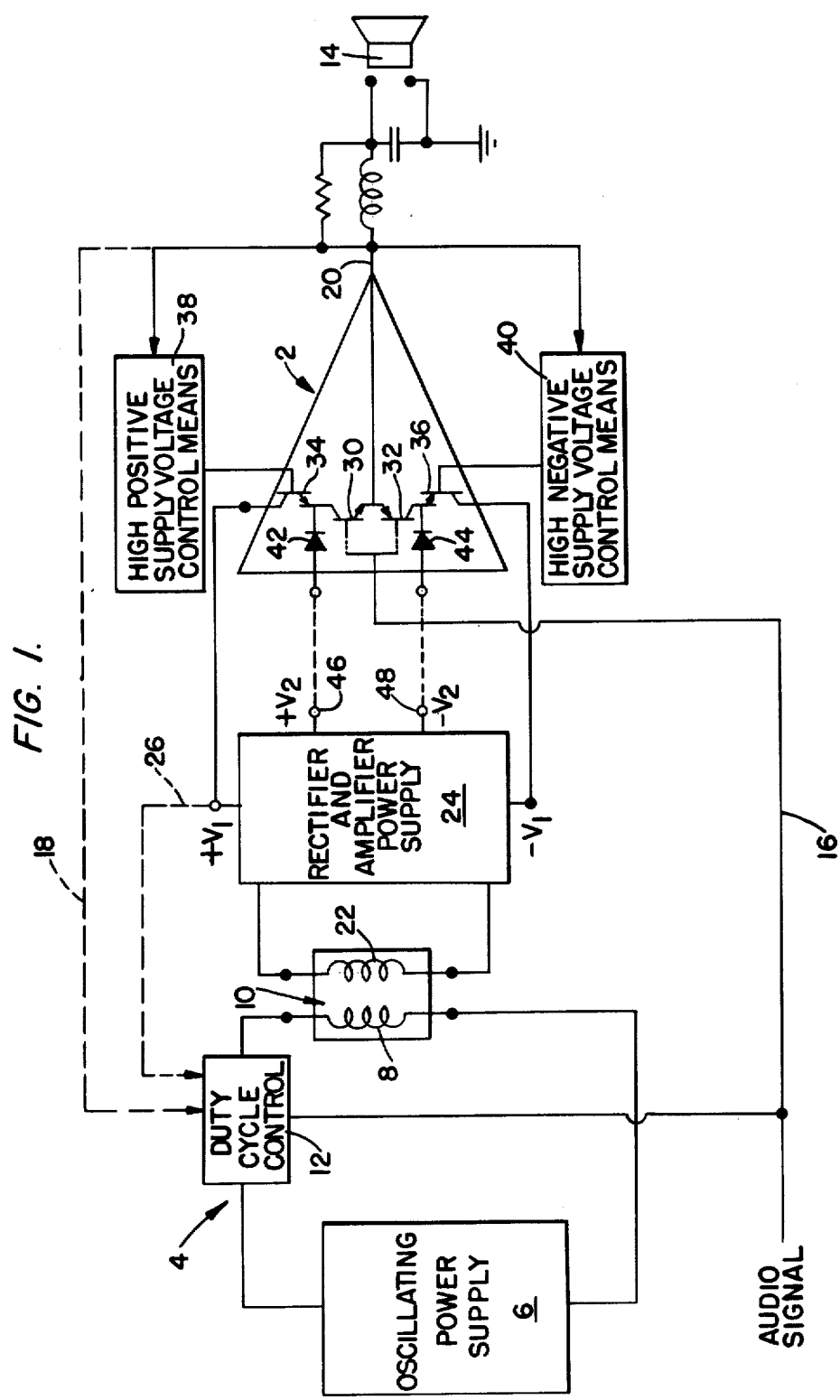
FIG. 1 is a schematic diagram illustrating the basic concepts of the present invention.

Referring to FIG. 1, a highly schematic diagram of an amplifier circuit 2 and power supply circuit 4 designed in accordance with the subject invention is illustrated. Electrical energy is supplied to the system by means of an oscillating power supply 6 which may take the form of a pulse generator or a source of commercially available current such as conventional 117–125 volt, 60 cycle alternating current. The primary coil 8 of a specially designed, light weight transformer 10 is connected to the oscillating power supply 6 by means of a duty cycle control circuit 12 designed to modulate the amount of energy supplied to primary coil 8 in at least partial dependence upon a characteristic of the audio signal which is to be amplified by the system for conversion into sound by speaker 14. The audio signal characteristic may be supplied directly over the audio input signal conductor 16 or may be provided through a feedback line 18 connected with the audio amplifier output 20. As will be explained in greater detail hereinbelow, the provision of a duty cycle control 12 in the supply circuit to the primary coil 8 results in the possibility of employing a much lighter weight transformer than has been thought to be necessary heretofor.

The transformer secondary coil 22 is connected to a rectifier and amplifier power supply 24 designed to provide a direct current supply voltage to amplifier 2 which may take the form of a voltage which varies widely in amplitude in dependence upon amplitude changes in the input audio signal or the form of a relatively constant output voltage. If the later type of amplifier power supply is employed, a voltage-level feed back line 26 maybe employed to cause the duty cycle control 12 to adjust the amount of power supplied to the primary coil 8 in order to assist in maintaining constant the output voltage from amplifier power supply circuit 24.

As will also be described in greater detail below, amplifier 2 has been specially designed to permit the use of low cost, low power rated transistor components. When designed in accordance with this invention, the amplifier may be operated in a manner to minimize the amount of heat which must be dissipated by the heat sinks in the output stage of the amplifier. This operation permits further reduction in the weight of the amplifier and power system by permitting the use of smaller, lighter weight heat sinks than have previously been required by amplifiers providing comparable power output. In particular the amplifier, which may be of the Class B push-pull type, includes at least a pair of output transistors 30 and 32 for amplifying the audio signal supplied on line 16 to the respective base electrodes thereof. In one embodiment of this invention amplifier 2 includes additional transistors 34 and 36 connected in series with transistors 30 and 32, respectively, to provide higher absolute supply voltage levels to the amplifier output 20 when necessary. When these higher voltages are unnecessary, transistors 34 and 36 remain non-conductive as determined by supply voltage control means, 38 and 40, respectively. When transistors 34 and 36 are non-conductive, voltage is supplied to the collectors of transistors 30 and 32 through diodes 42 and 44, respectively, which are in turn connected to lower voltage level taps 46 and 48, respectively, of amplifier power supply 24. To further reduce the power rating requirements for transistors 30 through 36, control means 38 and 40 are designed to cause the voltage drop across the transistor pairs 30, 34 and 32, 36 to be equally shared wherever transistors 34 or 36 are conductive, respectively. The manner by which this is achieved and the beneficial results that flow therefrom will be discussed in greater detail below.

The basic concept of utilizing power output feedback in an audio amplifier transformer to control the energy transfer between the primary and secondary windings of the transformer in response to the magnitude of the audio input signal can be effectively employed in a transformer which produces a fixed voltage output across the secondary. Moreover, when a fixed output transformer is involved, the power output feedback can also be used to assist in maintaining the voltage output constant. The FIG. 2 embodiment of the present invention illustrates such a system. The main power transformer 500 (i.e. magnetic field coil) has primary and secondary windings 500a and 500b, respectively.

For reasons more fully explained in connection with FIG. 8 below, the secondary 500b is tapped to provide plural positive and negative voltages stepped in 25 volt increments from 25 to 75 volts. The positive terminals are respectively designated E1 through E3, while the negative terminals are respectively designated E4 and E6.

The opposite ends of primary winding 500a are connected through current rectifying diodes to the two terminals of a conventional power source, indicated at 502, which can be a wall socket providing current at 60 Hertz and 120 volts. Two leads 504 and 506 from power source 502 are respectively connected through related rectifying diodes D501 and D503, and then in series with a silicon controlled rectifier 508, to the upper end 510 of transformer primary winding 500a. The leads 504 and 506 are also respectively connected through related second rectifying diodes D505 and D507 to the lower end 512 of primary winding 500a. An examination of the diodes D501, D503, D505 and D507 makes it readily apparent that these four diodes are arranged in a rectifying bridge so that on each half cycle from the power source, a positive voltage is directed to the silicon controlled rectifier 508 and thence to the upper end 510 of the transformer primary winding 500a.

Silicon controlled rectifier 508 is controlled by an audio input signal as will be explained more fully hereinbelow. The audio input signal is directed into an input terminal 514, and thence to a junction point 516. The resistors R501 and R503 are connected between junction 516 and a suitable voltage source (e.g. a 75 volt source) to provide a base voltage level of, for example, 0.7 volts. This voltage is developed by diode D509 connected from the junction of R503 and R501 to ground. The voltage is in turn directed to an operational amplifier 518. Feedback to the operational amplifier is obtained from the junction 520 of a diode D515 and capacitor 522 in the transformer secondary circuit. The point 520 is connected through two voltage dividing resistors R505 and R507 to ground. At a junction point 526 between the two resistors R505 and R507 there is a feedback connection to the operational amplifier 518. The output of operational amplifier 518 is directed to a suitable control apparatus indicated at 528. This control apparatus 528 is connected to the control terminal of silicon controlled rectifier 508 in a manner such that at higher output levels from operational amplifier 518, the rectifier 508 is caused to conduct at higher voltage levels on the latter portion of each half cycle. In like manner, when the output of the operational amplifier 518 is lower, the silicon controlled rectifier 508 is caused to fire at lower voltage levels.

The center of secondary winding 500b is tapped at 530 to ground. The upper half of the winding 500b is tapped at two intermediate locations 532 and 534 to respectively provide the positive 25 volt and 50 volt output for power terminals E1 and E2, while the upper terminal 524 of winding 500b provides the positive 75 volt output for terminal E3. In like manner, the bottom half of secondary winding 500b is tapped at intermediate locations 536 and 538 to provide the intermediate voltage levels of minus 25 and minus 50 volts at terminals E4 and E5, respectively, while the lower end 540 of the secondary winding provides the minus 75 volt output for terminal E6.

The three points 532, 534 and 524 are each connected through respective blocking diodes D511, D513 and D515 to their respective output terminals. A first capacitor 542 is provided between ground and the lower voltage output terminal (i.e. positive 25 volt terminal). A second capacitor 544 is connected between the positive 25 volt output terminal and the positive 50 volt output terminal, and the third capacitor 522 is in like manner connected between the positive 50 volt output terminal and the positive 75 volt output terminal. Capacitors 542, 544 and 522 have sufficient capacitance to compensate for any abrupt power demand from the related output terminal so as to maintain the output voltage terminals at nearly constant voltage level.

The lower half of secondary winding 500b is connected to its negative output terminals E4, E5, E6 through three blocking diodes D517, D519 and D521. Capacitors 546, 548 and 550 are respectively connected between the negative output terminals in substantially the same manner as the corresponding components for the upper half of the primary winding. However the blocking diodes D517 through D521 are reversed so as to permit only negative current to pass to the output terminals E4 through E6.

In the operation of the power supply of FIG. 2, the output voltage in the winding 500b is regulated entirely by the circuitry controlling the silicon controlled rectifier 508. The SCR control circuitry 508 is in turn governed by the audio input signal in a manner such that when the input signal is of a greater amplitude, the silicon controlled rectifier 508 is caused to conduct for greater portions of each power half cycle to transmit more current to primary winding 500a. This mode of operation can best be illustrated with reference to FIGS. 3A, 3B and 3C.

In FIG. 3A, there is a representation of the voltage delivered from power source 502 through the two diodes D501 and D503 to the silicon controlled rectifier 508. It can be seen that because of the action of the diodes D501 through D507, a positive sine wave voltage pulse is delivered to silicon controlled rectifier 508 on each half cycle. Let it be assumed that the audio input signal to the amplifier is of a relatively low amplitude, so that the power requirement of the amplifying circuit is quite low. In this condition, the silicon controlled rectifier 508 is caused to conduct only at the very end of each half cycle. The point of conduction of each half cycle is illustrated at 600, and rectifier 508 remains conductive until the current has reached zero, at point 602. Thus, it can be seen that the current is being delivered to the primary winding 500a in rather short increments of time, and at a lower voltage level.

As the audio input signal reaches a greater amplitude, silicon controlled rectifier 508 is caused to conduct at a higher voltage level for the latter part of each half cycle, as illustrated in FIG. 3B. The point of conduction occurs at 604, and each cut off point is indicated at 606. It can be seen that not only is the voltage higher, but also the time increment of each current pulse is longer, so that greater power is delivered to the primary winding 500a.

Finally, in FIG. 3C, there is shown the situation where the audio input signal is at a maximum amplitude, thus leading to a demand for maximum power from the transformer. In this situation, silicon controlled rectifier 508 is caused to conduct near the peak voltage at the beginning of the latter half of each half cycle, as illustrated at 608 in FIG. 3C, with the cut off point being indicated at 610. Thus, it can be seen that current is being delivered at yet a higher voltage and for a longer duration during each half cycle.

As the current builds up in the primary winding 500a during the latter part of each half cycle of current, no current flows in the secondary winding 500b, because of the arrangement of the blocking diodes D511 through D521. However, at the end of each half cycle of current through the primary winding 500a, after the current is shut off, the field around 500a collapses so as to create a voltage drop across the secondary winding 500b and cause current to flow through the secondary winding to supply power to the six capacitors 522 and 542 through 550 and the six output terminals E1 through E6.

As indicated previously, when the amplitude of the audio input signal is at higher levels, the power requirements on the transformer 500 are greater. During these periods, current will flow through the primary winding 500a for longer increments of time to store more energy in the magnetic field of primary winding 500a. When the current is shut off in the primary winding at the end of each half cycle, the magnetic field in the primary winding collapses to induce a flyback voltage across the secondary winding 500b. The diodes D511 through D521 are arranged so that current flows through the secondary winding to charge the capacitors 542, 544, 522, 546, 548 and 550 to maintain the voltage at the power terminals E1 through E6 at the proper level.

Figure 4A:
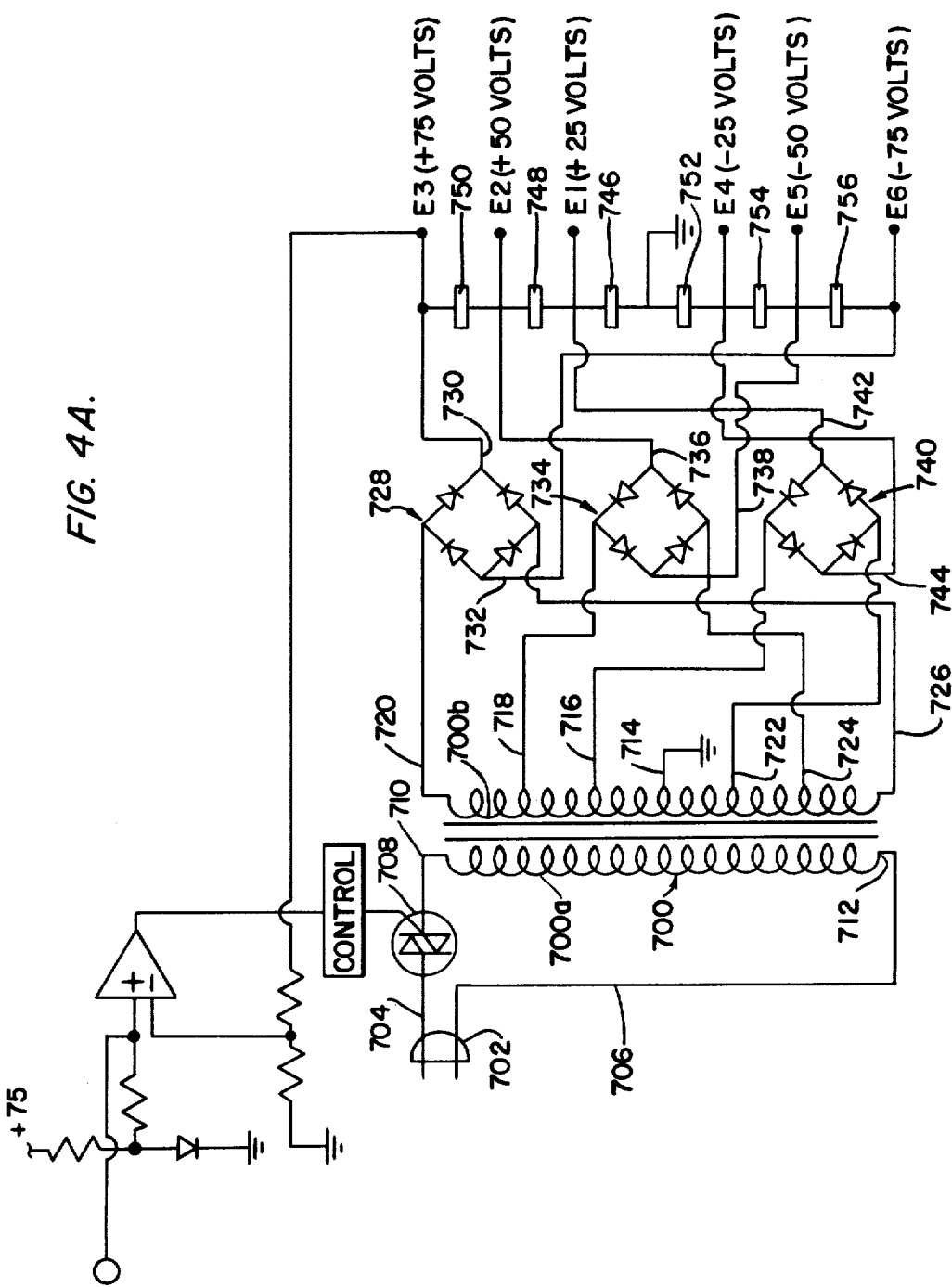
FIG. 4 is an alternative embodiment of a stepped voltage power supply constructed in accordance with the present invention.
FIG. 4B is a first modification of the switching circuitry for controlling the operation of the stepped voltage power supply of FIG. 4A.
FIG. 4C is a second modification of the switching circuitry for controlling the operation of the stepped voltage power supply of FIG. 4A.

FIG. 4A illustrates another embodiment of a stepped voltage power supply constructed in accordance with the present invention. As in the FIG. 2 embodiment, there is a power source such as wall plug 702 including two leads 704 and 706. Lead 704 is connected to a triac 708. The opposite side of the triac 708 connects to the upper end 710 of primary winding 700a in transformer 700. The outer lead 706 of power source 702 connects to the lower end 712 of primary winding 700a.

The triac 708 serves a function similar to that of the silicon control rectifier 508, except that triac 708 conducts on both positive and negative half cycles of the current from power source 702. Switching circuitry controls the triac 708 in a manner such that it conducts during the latter portion of each half cycle for longer or shorter periods of time, depending upon the power requirements of the amplifier. This switching circuitry is substantially the same as the circuitry which switches silicon controlled rectifier 508 in the FIG. 2 embodiment of the invention, and thus the circuit components will not be described in further detail.

The secondary winding 700b of transformer 700 is tapped to ground at its center point 714. The upper half of secondary winding 700b is tapped at two intermediate locations 716 and 718 to provide the positive 25 volt and 50 volt outputs for the power terminals E1 and E2. A connection 720 to the upper end of winding 700b provides the positive 75 volt output of power terminal E3. In like manner, the bottom half of the secondary winding is tapped at three equally spaced locations, 722, 724 and 726 to respectively provide the negative 25, 50 and 75 volt outputs E4, E5 and E6.

The positive and negative 75 volt leads 720 and 726 are attached at opposite ends to a first bridge rectifier, generally indicated at 728. The positive output of bridge rectifier 728 is connected by lead 730 to the positive 75 volt power terminal E3, and the negative output of the bridge rectifier 728 is connected to the negative 75 volt power output E6 through lead 732. The positive and negative 50 volt leads 718 and 724 are connected to the opposite ends of a second bridge rectifier 734. The positive output terminal of bridge rectifier 734 is connected by lead 736 to the positive 50 volt power terminal E2, while the negative output from the bridge rectifier 734 is connected through lead 738 to the negative 50 volt power terminal E5. Finally, the positive and negative 25 volt leads 716 and 722 are connected to opposite ends of a third bridge rectifier 740. The output leads 742 and 744 of bridge rectifier 740 are respectively attached to the positive and negative 25 volt power terminals E1 and E4.

As in the FIG. 2 embodiment, six capacitors, designated 746 through 756, are provided between the power output terminals E1 through E6 to compensate for any abrupt power demand on the related output terminal so as to maintain the output voltage terminals at nearly constant voltage level.

Figure 4B:
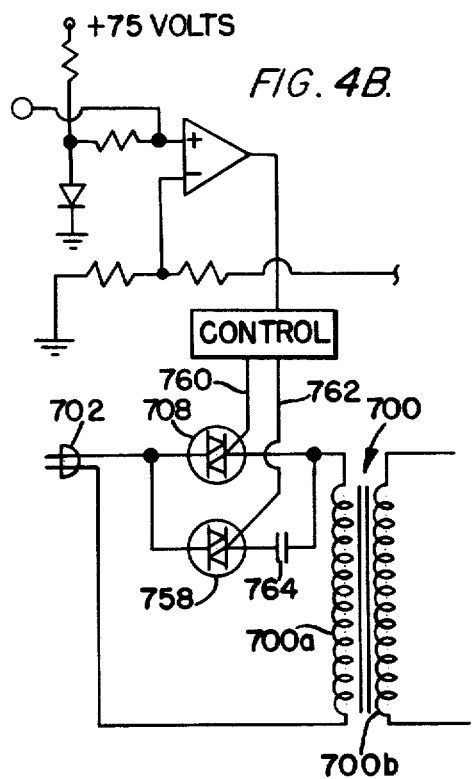
Figure 4C:
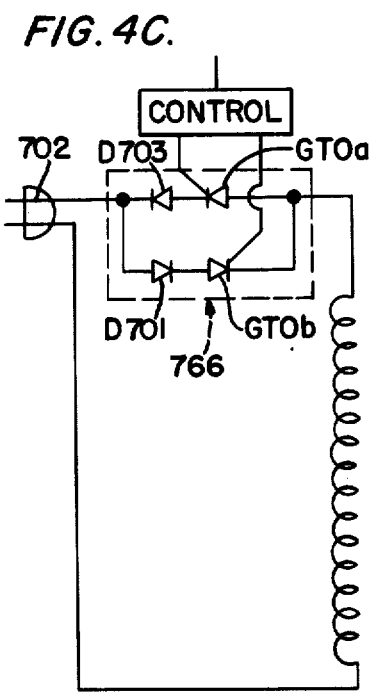
Figure 5A:
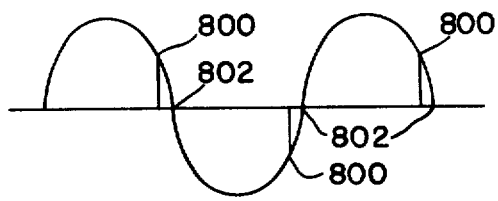
FIGS. 5A through 5C illustrate various current cycle waveforms flowing through the primary winding of the power supply of FIG. 4A.
Figure 5B:
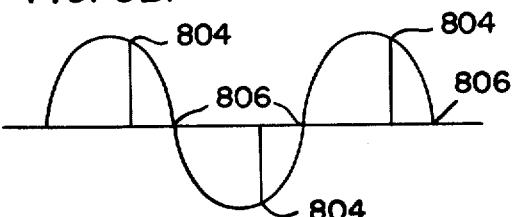
Figure 5C:
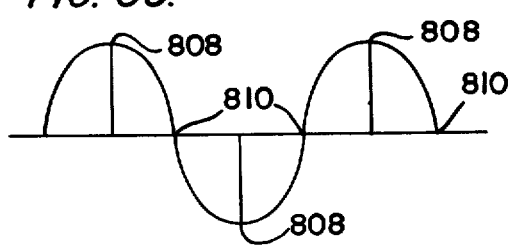

To describe the operation of the embodiment of FIG. 4, reference is made to FIGS. 5A, 5B and 5C. The current through primary winding 700a is not rectified and is thus an alternating current. The triac 708 is caused to conduct in the latter half of each half cycle, whether it be a positive or negative half cycle. When the power requirements of the amplifier are low, the control apparatus acts to cause triac 708 to conduct for only a very short time period at the end of each half cycle. This is illustrated in FIG. 5A, where the point of conduction of each half cycle is illustrated at 800. Triac 708 remains conductive until the voltage has reached zero at point 802. Thus, it can be seen that current is being delivered to the primary winding in rather short increments of time, and at a lower voltage level.

As the control signal reaches a greater amplitude, the triac 708 is caused to conduct at a higher voltage level for the latter part of each half cycle, as illustrated in FIG. 5B, where the point of conduction is indicated at 804, and each cutoff point is indicated at 806. It can be seen that not only is the voltage higher, but also the time increment of each current pulse is longer, so greater power is delivered to primary winding 700a.

Finally, in FIG. 5C, there is shown the situation where the input signal is at a maximum amplitude, thus providing for maximum power requirements. In this situation, triac 708 is caused to conduct near the peak voltage at the beginning of the latter half of each cycle, as illustrated at 808, with the cutoff point being indicated at 810.

Current flows in the secondary winding 700b simultaneously with the flow of current in 700a, with the current in 700b also being an alternating current. With regard to the flow of current through the two 75 volt leads 720 and 726, since this current flows through the rectifying bridge 728, the output to the power terminal E3 is always positive, while the output to the terminal E6 is always negative. In like manner, current is directed from the intermediate terminals 716, 718, 722 and 724 through the two bridge rectifiers 734 and 740 to provide positive current to the output terminals E2 and E1 at the positive 50 and 25 volt levels, and to provide negative current to the power output terminals E5 and E4 at the negative 50 and 25 volt levels, respectively.

It has been found that by using the power supply circuitry of the present invention, the transformer can be made relatively small and still provide adequate power. For example, the transformer in the present invention can be made from ¼ to 1/10 the size of the transformer in a conventional audio amplifier of comparable power rating, with one hundred and seventy five windings in the primary and two hundred in the secondary.

It is sometimes desirable to adjust the cutoff point of current flow through transformer primary 700a in order to more precisely control the characteristics of the energy transfer across the transformer windings during each half cycle of current from the power source. For example, shutoff of the primary current prior to the zero crossover voltage point in the current waveform eliminates idling currents in the primary winding during the remaining portion of the waveform half cycle. Accordingly, FIGS. 4B and 4C illustrate two modifications to the switching circuitry of FIG. 4A, both of which modifications enable the transformer primary winding 700a to receive current during more narrowly defined portions of the power cycle.

In FIG. 4B, a second Triac 758 is connected in parallel with Triac 708. A control apparatus as previously described in connection with FIG. 2 controls the operation of Triacs 708 and 758 respectively via leads 760 and 762. A capacitor 764 is connected in series with Triac 758 and acts to periodically shunt Triac 708. The circuit of FIG. 7B operates as follows. In response to an audio input signal, output from the control apparatus causes Triac 708 to conduct at some point during each positive and negative half cycle of the current from power source 702. At a later predetermined time the output from the control apparatus causes Triac 758 to conduct, whereupon current is diverted from Triac 708 and begins to flow through capacitor 764. Triac 708 shuts off but current continues to pass through Triac 758 and capacitor 764 to transformer primary 700a until the voltage buildup in capacitor 764 reaches a level sufficient to turn Triac 758 off, thus ending current flow through the transformer primary. Capacitor 764 is very small in order to limit the conductive state of Triac 758 to a short period of time.

FIG. 4C illustrates a second modification of the embodiment of FIG. 4A where the single triac 708 is replaced by a switching apparatus indicated generally at 766. A pair of GTO SCR's are connected in parallel with one another. One GTO, designated GTOb, conducts on positive half cycles and a second GTO, designated GTOa, conducts on negative half cycles. Blocking diodes are provided at D701 and D703. Each GTO becomes conductive at a predetermined voltage, as provided by the control mans, and becomes non-conductive, as provided by the control means, within a predetermined control time period, preferably one millisecond.

Figure 6A:
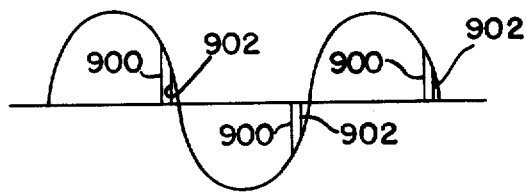
FIGS. 6A through 6C illustrate various current cycle waveforms flowing through the primary winding of a power supply switched in accordance with the circuitry of FIGS. 4B or 4C.
Figure 6B:
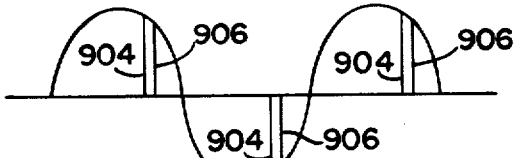
Figure 6C:
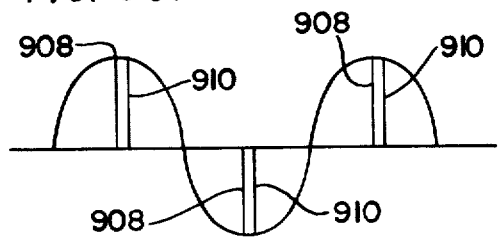
Figure 7A:
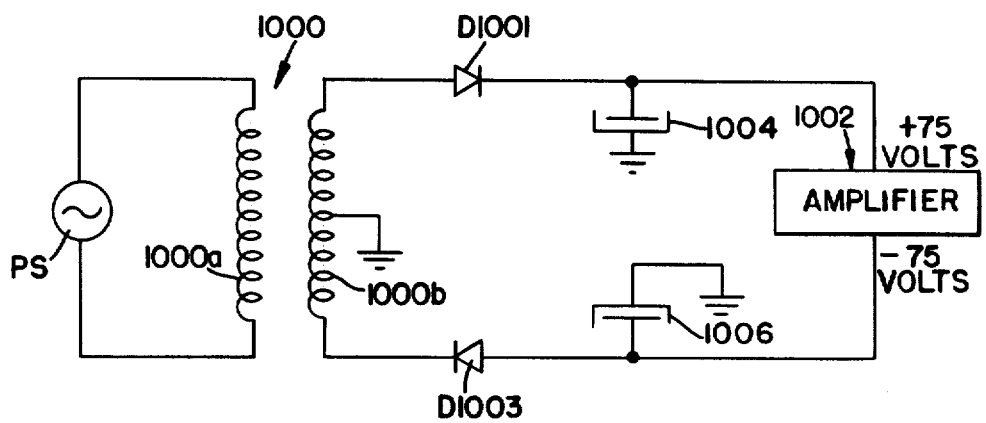
FIG. 7A is a circuit diagram of a conventional power supply and audio amplifier.
Figure 7B:
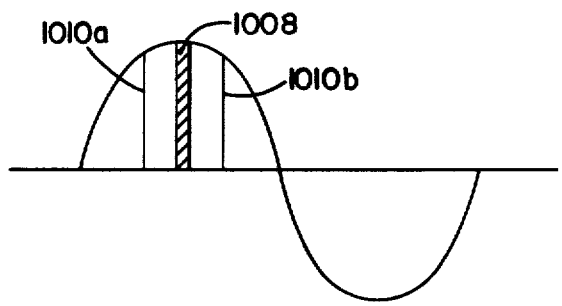
FIG. 7B is a diagram of typical conduction periods of a conventional transformer secondary of the type illustrated in FIG. 7A.
Figure 7C:
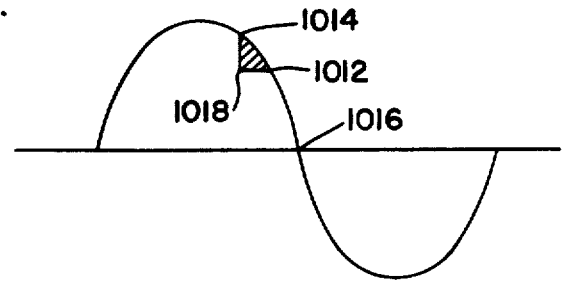
FIG. 7C is a diagram of typical conduction periods of a transformer secondary constructed in accordance with the present invention.

FIGS. 6A, 6B and 6C illustrate the manner of switching common to both the FIGS. 7B and 7C modifications. At low power requirements the current flow begins at 900 and ends at 902 near the latter part of the last part of each half cycle. At intermediate power requirements, the on-off switching occurs earlier in the latter half of each half cycle, illustrated in FIG. 6B at 904 and 906. At peak power requirements, the switching occurs near the peak of each half cycle, illustrated in FIG. 6C at 908 and 910. With this arrangement, the transformer can be made yet smaller.

For purposes of clearly demonstrating the advantages of the various duty cycle controlled power supply embodiments discussed above, reference is made to FIG. 7A, which illustrates the basic configuration of a conventional amplifier power supply. Conventional 117-125 v 60 cycle AC is supplied from PS to the primary winding 1000a of a transformer 1000. The secondary winding 1000b of transformer 1000 has its upper end connected through a diode D1001 to the upper terminal of the amplifier 1002. The lower terminal of the secondary winding 1000b is connected through a second diode D1003 to the lower terminal of amplifier 1002. Upper and lower capacitors 1004 and 1006 respectively maintain the voltage imposed upon the amplifier 1002 at a substantially constant value. Normally, the supply voltage has a peak voltage input of approximately 169 volts. Let it be assumed that the input voltage imposed at the upper terminal of the amplifier 1002 is designed to be plus 75 volts and the voltage at the lower terminal is minus 75 volts. The center of the secondary winding 1000b is normally tapped to ground.

An audio sound typically has peak power requirements of relatively short duration and average power requirements of longer duration which are possibly 1/20th of the peak power requirement. Thus, most of the time the amplifier is operating at only 1/10th to 1/20th of full power. To understand the implication of this fact, reference is made to FIG. 7B illustrating the sine wave of incoming voltage supplied to the primary of a conventional audio amplifier transformer connected to receive conventional 117 to 125 v alternating current. The turns ratio of the primary and secondary winding of the conventional transformer is such that with the primary conducting at least some current throughout the entire sine wave of the incoming voltage, the peak voltage generated in the secondary is just slightly larger than the plus 75 and minus 75 volt level required by a conventional audio amplifier. When the amplifying component of the amplifier is demanding only average power, current flows in the secondary winding for only a very short period of time at the very peak of the sine wave of the input voltage. This time period is indicated at 1008 in FIG. 7B. When there are peak power requirements, there is an immediate drain on the conventional storage capacitors 1004 and 1006 of the power supply to lower their voltage levels slightly, and the result is that the secondary winding is conducting for a longer time period, so that the conducting portion of the sine wave of FIG. 7B is broadened out to, for example, lines indicated at 1010a and 1010b. It should be noted that since the two lines 1010a and 1010b are spaced further apart, the voltage produced in the secondary winding 1000a is moderately down from the peak voltage delivered at 1008.

In designing a transformer suitable for use in a conventional amplifier power system as described above, careful consideration must be given to accomodating the idling current in the primary. Idling current is the current which flows in the primary when no current is flowing in the secondary. In a transformer having a small number of windings in the primary and thus a small inductance, the primary idling current may become large enough to cause the transformer to heat up to an undesired extent. This fact dictates the use of a primary coil having a large number of windings.

A suitable audio amplifier transformer of conventional design must also be capable of accomodating a relatively large current flow through the primary and secondary coils in order to handle peak power demands. Thus the wire forming the coils must be of sufficient diameter to allow the transformer to deliver high current at peak loads, without too much internal resistance. The result is a very large, heavy transformer having a large number of windings to keep the inductance in the primary sufficiently high, and relatively thick wire to keep the resistance relative low in spite of the rather long length of wire in the transformer.

In contrast with a conventional power supply transformer, a transformer designed for use in the duty cycle controlled power supply of the present invention will normally be formed with a higher secondary to primary turns ratio than is conventional in non-duty cycle controlled transformers employed in commercial amplifier power supply circuits. With such a turns ratio, the point on the sine wave input to the primary at which current would stop flowing in the secondary can be made to occur well down the back slope as illustrated at point 1012 of FIG. 10C. Without duty cycle control the power supply equipped with such a transformer would be supplying voltage substantially above the desired plus 75 and minus 75 volt levels normally required by conventional audio amplifiers. With duty cycle control, no current will flow in the primary of the transformer when the duty cycle switching element is open except for very small leakage currents allowed by the solid state switching element when in the open condition. These leakage currents can be ignored for purposes of this discussion. The switching element remains in a non-conducting position until the voltage in the primary drops to a point 1014 just above the 1012 level. Then, current flows in the secondary between points 1014 and 1012. If the switching element is a self-commutating SCR, the switching element will remain in a conducting state down to point 1016 but no current will be flowing in the secondary from point 1012 to point 1016 since the diodes connecting the storage capacitor's in the power supply to the transformer secondary will become back biased.

Causing current flow in the secondary of a duty cycle controlled power supply during the time between points 1014 and 1012 of FIG. 7C would appear at first observation to be a little more inefficient than causing secondary current flow in a conventional amplifier as represented by 1008 in FIG. 7B. This is because the capacitors 1004 and 1006 only want to accept current at the 75 volt level. Thus, there are some resistance losses which occur in the duty cycle controlled transformer, these being represented by the shaded triangle between points 1012, 1014 and 1018 in FIG. 10C. However, a duty cycle controlled transformer can get by with many fewer turns (only a small fraction of the turns in a conventional transformer), so that the length of wire in the transformer is reduced. This reduces the internal resistance of the transformer proportionately.

Figure 7D:
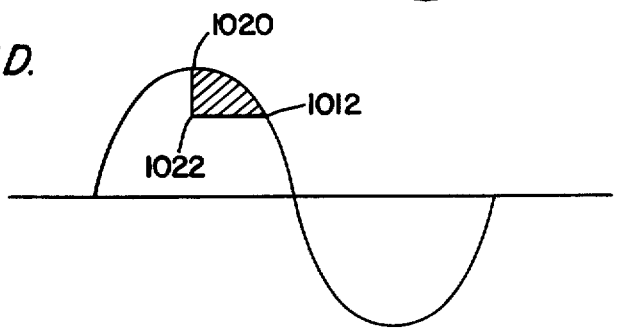
FIG. 7D is a diagram of the peak load conduction periods of a transformer secondary constructed in accordance with the present invention.

Let it now be assumed that the smaller duty cycle controlled transformer is operated at peak power requirements as is illustrated in FIG. 7D. In this situation the switching element moves the "switch on" point further up the sine wave, which would be at a maximum at approximately point 1020 near the peak of the sine wave. Let it further be assumed that the capacitors 1004 and 1006 are sufficiently large so that they are maintaining voltages of plus 75 and minus 75 volts pretty much at that level. The voltage generated in the secondary at point 1020 would be substantially higher than the plus 75 volt level (possibly 90 volts), ignoring losses in the transformer. Therefore, the voltage difference represents the losses in the transformer itself. These losses are represented in the shaded triangle between point 1012, 1020 and 1022 in FIG. 7D. Due to the fact that peak power is rarely required by audio amplifiers for more than a very short time, the somewhat greater losses represented by FIG. 10D can be tolerated in order to obtain the compensating gains of cutting off idling currents during the first part of each cycle of the conventional A.C. input sine wave. When the switching element in the primary coil includes means for turning off the current flow in the primary coil prior to return of the waveform to a zero voltage (such as is illustrated in FIGS. 6A through 6C), even greater reduction in idling current losses can be achieved.

In summary, most of the time an amplifier power supply is operating in the low power mode, as shown in FIG. 7C. Accordingly, the smaller duty cycle controlled transformer of the present invention can operate with about the same efficiency as the much larger prior art transformer. This is due in part to the number of primary and secondary turns being cut down substantially, thereby permitting the transformer wire to be much shorter and thus offering less resistance in the transformer itself. This lessened resistance makes the existence of the idling current in the latter portion of each half cycle more tolerable. When higher power levels are required, there is potential for greater inefficiency. However, this is offset by the low internal resistance of the transformer, and in any case it is possible to live with these higher inefficiencies for a short period of time, since they will not be large enough to overheat the transformer.

The following table includes the results of testing several different transformer designs wherein the transformers were tested by connecting the 50 volt output terminals of the secondary to two 150 watt light bulbs. The output of the secondary winding was maintained at 300 watts. Temperature was measured at the top center portion of the transformer.

TABLE I

| Transformer Number | Turns in Primary | Turns Ratio Sec/Prim. | Wire Size | Primary Inductance | Resistance Primary/Sec. | Temp C.° after 21 Min. |
|---|---|---|---|---|---|---|
| 9 | 149 | 0.66 | #18 & #17 | 58.6 | 485/733 | 31° |
| 8 | 131 | 0.82 | #18 & #17 | 52.7 | 400/789 | 45° |
| 7 | 113 | 1.03 | #18 & #17 | 32.2 | 335/812 | 62° |
| 1 | 90 | 1.14 | #18 | 33.7 | 330/888 | 64° |
| 4 | 113 | 1.14 | #18 | 32.3 | 330/993 | 67° |
| 6 | 113 | 1.14 | #18 & #17 | 33.7 | 330/888 | 71° |
| 3 | 141 | 1.14 | #20 | 58.1 | 538/1560 | 75° |
| 2 | 113 | 1.14 | #19 | 43 | 452/1470 | 84° |
| 5 | 177 | 1.14 | #20 | 97 | 800/2340 | 107° |

The results of these tests indicate that a preferable duty cycle transformer designed for operation in a power supply built in accordance with this invention would be a transformer having a secondary to primary turns ratio below 1.0 with a primary inductance above 30 millihenries and a coil wire gauge diameter above no. 18 when the transformer is used to produce a maximum ±75 volt D.C. output from conventional 117–125 volt, 60 cycle alternating current.

Figure 11:
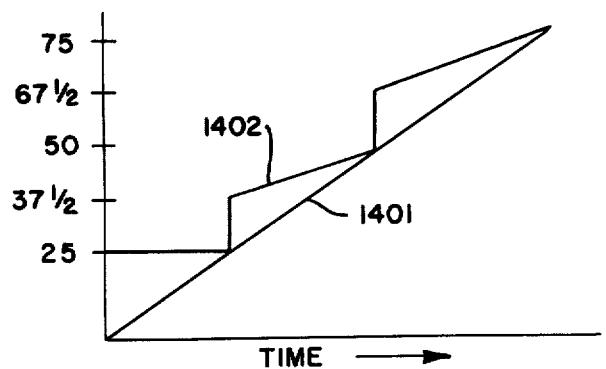
FIG. 11 is a diagram of the voltage output of the amplifier illustrated in FIG. 10.

FIG. 11 depicts an amplifying apparatus 1100 designed to utilize the stepped voltage power supply illustrated in FIGS. 2 and 4A–4C. A signal voltage is provided at 1102, and the output of the amplifier is connected through a load (shown herein as a speaker 1104) to ground. The apparatus employs two sets of transistors arranged in push-pull relationship, with each set being connected in series. The first set Q1101, Q1103 and Q1105 are NPN transistors, and these are used to amplify positive portions of the input signal. The other set of transistors Q1107, Q1109 and Q1111 are PNP transistors and are used to amplify negative portions of the input signal. In the following description, the overall operation of the first set of transistors Q1101, Q1103, Q1105 will be described in detail, with the understanding that the same description would apply to the operation of Q1107, Q1109 and Q1111 with respect to the negative portions of the signal.

It will be noted that the emitter electrode 1106 of Q1101 is connected to a power output terminal 1108 of the load 1104, and the collector electrode 1110 of Q1101 is connected through a diode D1101 to a D.C. voltage source E1 having a magnitude of plus 25 volts. The emitter electrode 1112 of the second transistor Q1103 is connected to the collector electrode 1110 of Q1101, and the collector electrode 1114 of the transistor Q1103 is connected through a second diode D1103 to an intermediate D.C. voltage source E2 having a magnitude of plus 50 volts. Finally, the third transistor Q1105 has its emitter electrode 1116 connected to the collector electrode 1114 of Q1103, and its collector electrode 1118 is connected directly to a higher D.C. voltage source E3, which is shown as having a magnitude of plus 75 volts.

As discussed previously herein, under the topic heading "Background of the Invention", various arrangements of series coupled transistors, with the stepped voltage sources of increasing magnitude are shown in the prior art. It is believed that a better understanding of the operating features of the present invention will be achieved by preceding a detailed description of the present invention with a general discussion of the general mode of operation of prior art devices using an arrangement of series connected transistors with stepped voltage sources.

To discuss generally the prior art modes of operation, when the signal voltage is relatively small (e.g. below 25 volts) only the first transistor Q1101 would be conductive, and all of the power would be derived from the 25 volt power source E1. The obvious advantage is that there is less voltage drop across the transistor Q1101 and thus an increase in efficiency.

When the signal voltage closely approaches the value of the first voltage level, in prior art devices the signal voltage is then applied in some manner to the base of the transistor Q1103 to make it conductive, so that the power is derived from the 50 volt source E2, with the 25 volt source being blocked out by the diode D1101. While the signal is fluctuating between the 25 volt and 50 volt level, substantially all or at least the major portion of the voltage drop is taken across the second transistor Q1103.

In like manner, when the signal voltage rises above the 50 volt level, the voltage signal is applied to the base of the transistor Q1105 to make it conductive and thus derive power from the 75 volt power source E3. Also, with the signal voltage fluctuating between the 50 and 75 volt level, substantially all, or at least the major portion of, the voltage drop is taken across the third transistor Q1105. Thus, with regard to the prior art devices, each of the transistors must be made with the capability of withstanding the voltage drop imposed across the transistor at the current levels existing at the various voltage levels.

Reference is again made to FIG. 8. To discuss specifically the present invention, it will be noted that the signal input terminal 1102 is connected through an operational amplifier 1120 to a biasing transistor Q1113. The collector electrode of transistor Q1113 is connected through a resistor R1101 to a plus 75 volt source. The base electrode 1122 of the transistor Q1101 is connected at a junction point between the resistor R1101 and transistor Q1113 to provide a forward bias to the transistor Q1101. The base electrode 1124 of the second transistor Q1103 is connected to a first switch and control means, indicated at 1126, and the base electrode 1128 of the third transistor Q1105 is connected to a second switch and control means, indicated generally at 1130.

The second set of transistors Q1107, Q1109 and Q1111 are similarly connected. Thus, the biasing transistor Q1113 is connected in series with a resistor R1103 to a minus 75 volt source, with the base electrode 1132 of transistor Q1107 connected to a terminal between transistor Q1113 and resistor R1103. The respective base electrodes 1134 and 1136 of transistors Q1109 and Q1111 are respectively connected to a third switch and control means 1138 and a fourth switch and control means 1140. Negatively stepped voltage sources E4, E5 and E6 are provided in the same manner as the sources E1, E2 and E3.

As shown herein, the input from 1102 is through an operational amplifier 1120 to the base 1142 of biasing transistor Q1113. There is a feedback from the output junction 1144 between the transistors Q1101 and Q1107 back through the resistors R1105 and R1107 to ground. From the junction 1146 intermediate transistors R1105 and R1107, there is a feedback connection back to operational amplifier 1120. The resistors R1109 and R1111 provide an initial biasing voltage to the transistors Q1101 and Q1107, respectively.

The general function of each of the switch and control means 1126, 1130, 1138 and 1140 is to cause a related transistor to become conductive at the appropriate time and then to apportion the voltage drop across the relative transistor so as to minimize the power which must be dissipated by any transistor at any particular time. The manner in which this is accomplished can best be described with reference to the graphs of FIGS. 9A, 9B and 9C.

In FIG. 9A the voltage drop across the first transistor Q1101 is plotted against the output voltage. Let it be assumed that the signal voltage has climbed to a low level of five volts. This voltage is applied to transistor Q1101 to cause it to become conductive to transmit current from the postive 25 volt source E1 through transistor Q1101 and to the output terminal 1108. Thus the voltage at output terminal 1108 will be approximately 5 volts, and the voltage drop across transistor Q1101 will be approximately 20 volts. As the signal current increases to a value closer to the 25 volt level, the voltage level at output terminal 1108 increases, while the voltage drop across transistor Q1101 decreases.

When the signal voltage comes within one or two volts of the 25 volt level, the first switch and control means 1126 becomes operative and directs current to the base electrode 1124 of transistor Q1103 at a voltage level intermediate the level of the output voltage and the value of the positive fifty volt source E2. The graphs of FIGS. 9A and 9B illustrate this relationship in a somewhat idealized manner, where the first switch and control means 1126 functions to apply a voltage to base electrode 1124 consistently mid-way between the output voltage and the plus 50 volt level at E2, so that the voltage drop across the two transistors Q1101 and Q1103 remain substantially equal for all output voltages between 25 and 50 volts. In the actual embodiment shown herein, the apportioning of the voltage drop across transistors Q1101 and Q1103 would depart moderately from this idealized situation.

When the signal voltage comes very close to the 50 volt level, then the second switch and control means 1130 makes the third transistor Q1105 become conductive and also transmits base current to the base electrode 1128 of Q1105 at a sufficiently high voltage so that only a portion of the total voltage drop is across the transistor Q1105. In like manner, the first switch and control means 1126 continues to supply current to the base electrode 1124 of transistor Q1103 so that the voltage drop across Q1103 is within its apportioned share of the total voltage drop across the three transistors Q1105, Q1103 and Q1101.

Again, the somewhat idealized situation is shown in FIGS. 9A, 9B and 9C, in that with the output voltage between 50 and 75 volts, the voltage drop is equally apportioned among all three transistors. In actual practice, the apportioning would not be that precise.

The manner in which the four switch and control means 1126, 1130, 1138 and 1140 operate will now be described. Since each of the four switch and control means are substantially identical, only the first means 1126 will be described in detail.

In the first switch and control means 1126, there is a control transistor Q1115 having its collector electrode 1148 connected to the base electrode 1124 of the second power transistor Q1103. The base electrode 1150 of transistor Q1115 is attached to a junction point 1152 between two voltage dividing resistors R1113 and R1115. The other end of the resistor R1113 is connected to a positive 75 volt terminal, while the other end of resistor R1115 is connected to ground.

The emitter electrode 1154 of the transistor Q1115 is connected through a resistor R1117 to a juncture point 1156 between two voltage dividing resistors R1119 and R1121. The other end of resistor R1121 is connected to a positive 75 volt source, while the other end of resistor R1119 is connected to the main output line 1158 leading to the output terminal 1108. A capacitor 1160 is connected in parallel with the resistor R1119 to alleviate rapid voltage changes across the resistors R119 and R1121.

As discussed previously herein, it is desirable to have transistor Q1103 become conductive when the signal voltage (and consequently the output voltage which should be substantially identical to the signal voltage) reaches a level just below the 25 volt level. It is also desirable to have the current supplied to the base electrode 1124 of the transistor Q1103 at a voltage level approximately intermediate the output voltage and the next stepped voltage in the power source, which is the 50 volt power source E2. Accordingly, when the output voltage reaches approximately the 25 volt level, it is desired that the base electrode 1124 of transistor Q1103 have a current delivered thereto at a voltage approximately midway between 25 and 50 volts (e.g. approximately 37½ volts).

The value of the resistances R1113 and R1115 are selected so that when little or no base current is flowing to the base electrode 1150 of the transistor Q1115 the voltage at junction point 1152 is approximately 37.5 volts. The values of the two resistors R1119 and R1112 are so selected that when the output voltage comes within one or two volts of the voltage of the lowest power terminal (i.e. 25 volts) the voltage at junction 1156 is approximately 38.2 volts so as to apply a forward bias to the emitter electrode 1154 of the transistor Q1115 to cause transistor Q1115 to conduct and transmit base current to the base electrode 1124 of the transistor Q1103. Since the collector electrode 1114 of transistor Q1103 tends to follow the voltage of base electrode 1124 within a fraction of a volt, the immediate effect would be to bring the voltage at the emitter electrode 1112 of Q1103 to approximately 37.5 volts. Thus, with an output voltage of approximately 25 volts, the voltage drop across transistor Q1103 would be approximately 12.5 volts, and the voltage drop across transistor Q1101 would be 12.5 volts, thereby causing the power dissipated to be shared equally by Q1101 and Q1103.

As the signal voltage increases in the 25 volt to 50 volt range, the voltage at junction point 1156 likewise increases so as to tend to drive the voltage at the emitter electrode 1154 of transistor Q1115 upwardly. This causes an increase in current to the base electrode 1150 of Q1115, thus raising the voltage of junction point 1152 to a level closer to the voltage of emitter electrode 1154 and also causing transistor Q1115 to be more conductive so that greater current is supplied to the base electrode 1124 of transistor Q1103 at yet a higher voltage. The effect of this is to raise the voltage at emitter electrode 1112 of transistor Q1103 even higher (i.e. closer to the 50 volt level). Thus, as the output voltage increases from the 25 volt level toward the 50 volt level, the voltage drop across transistor Q1103 diminishes to apportion the voltage drop between the transistors Q1103 and Q1101.

By the time the signal voltage reaches the second power source increment level (i.e. the 50 volt level), substantially all of the voltage drop is across the load, and there is very little voltage drop across the two transistors Q1101 and Q1103. At this time, the second switch and control means 1130 becomes operative to cause the third transistor Q1105 to become conductive. Because this is accomplished in substantially the same manner as in the first switch and control means 1126, the operation of the means 1130 will be summarized only briefly.

It can be seen that there is a control transistor Q1117 having a collector electrode 1148a connected to the base electrode 1128 of transistor Q1105. There are a pair of voltage dividing resistors R1113a and R1115a producing a voltage level of approximately 62.5 volts at juncture point 1152a. Also, the two voltage dividing resistors R1119a and R1121a are arranged such that when the output voltage reaches a level just below the 50 volt level, the voltage at junction point 1156a is approximately 63.2 volts.

Thus, when the output voltage comes quite close to the 50 volt level, a forward bias is applied between the emitter electrode 1154a of transistor Q1117 and base electrode 1150a to cause the transistor Q1117 to conduct, thereby supplying base current to the base electrode 1128 of transistor Q1105 to cause transistor Q1105 to conduct. As soon as Q1105 becomes conductive, the voltage of the emitter electrode 1116 of Q1105 rises to a level close to that of base electrode 1128 of Q1105 (i.e. approximately 63.2 volts). This causes the diode D1103 to block off the 50 volt power source so that all of the power is derived from the plus 75 volt power source.

When the output voltage is slightly above 50 volts, the voltage at which current is being delivered through transistor Q1115 to the base electrode 1124 of transistor Q1103 is intermediate between the output voltage and the voltage of the current to the base electrode 1128 of transistor Q1105. Thus, the voltage drop from the 75 volt source to the level just above the 50 volts being delivered to output terminal 1108 is apportioned between the three transistors Q1101, Q1103 and Q1105. As the output voltage increases further toward the 75 volt level, the voltages at the junction points 1156 and 1156a increase proportionately to raise the voltage of the currents respectively delivered to the base electrodes 1124 and 1128 of transistors Q1103 and Q1105, thus increasing the voltage level at the respective emitter electrodes 1112 and 1116 of transistors Q1103 and Q1105. Consequently, the voltage drop across the three transistors Q1101, Q1103 and Q1105 continues to be apportioned between the three transistors. As indicated previously, the apportioning illustrated in the graphs of FIGS. 9A, 9B and 9C is somewhat idealized, and the actual voltage drops will depart somewhat from the precisely equal apportionment.

The operation of the third and fourth switch and control means 1138 and 1140 is substantially the same as that of the first and second switch control means 1126 and 1130 respectively, except that the means 1138 and 1140 operate on the negative portions of the input signal. Accordingly, the operation of the means 1138 and 1140 will not be described in detail.

It is sufficient to note that transistor of switch control means 1138 is designated Q1119 while the control transistor of switch control means 1140 is designated Q1121. The control transistors Q1119 and Q1121 operate in substantially the same manner as corresponding transistors Q1115 and Q1117 to make the power transistors Q1109 and Q1111, respectively, conductive at the proper negative voltage levels. Transistors Q1119 and Q1121 also control the voltage level of the emitter electrodes of transistors Q1109 and Q1111 to apportion the voltage drop across the three transistors Q1107, Q1109 and Q1111.

Figure 10:
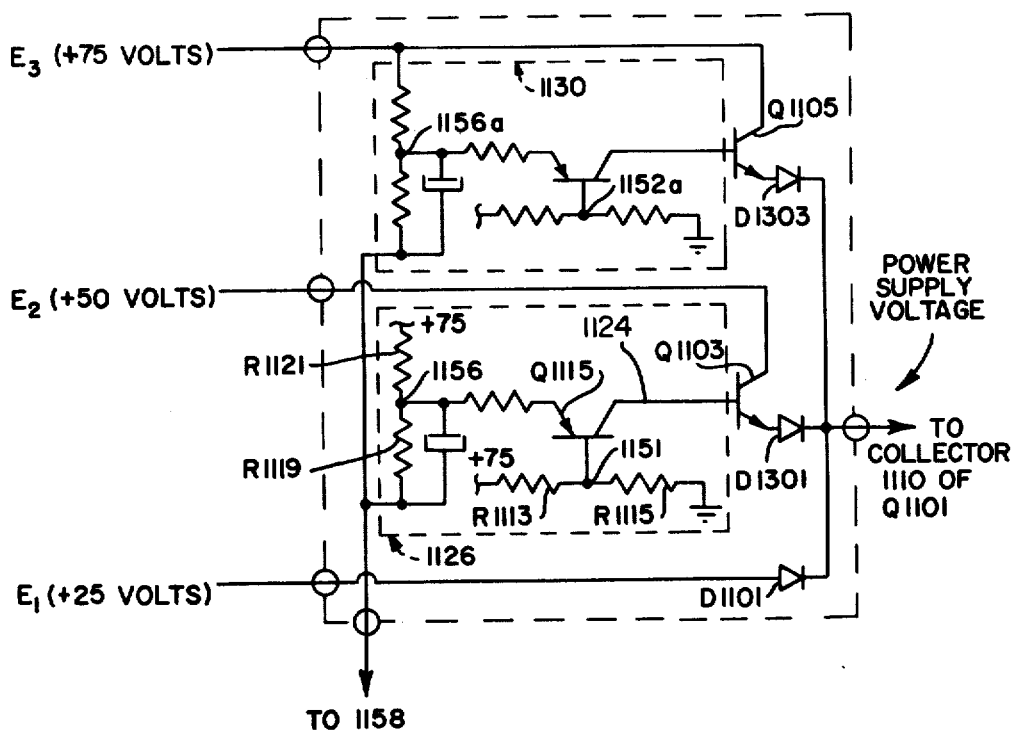
FIG. 10 is another embodiment of an amplifier constructed in accordance with the present invention.

Referring now to FIG. 10, an alternative arrangement of the output stage transistors and transistor control means for use in an audio amplifier of the type illustrated in FIG. 11 is disclosed. In particular, those components in FIG. 10 which are identical with the components of FIG. 11 have been identified by the same reference numerals. The voltage dividing resistors R1115 and R1113 are selected so that the voltage at 1152 will be 37½ volts when the voltage at 1156 reaches approximately 38 volts as described above, thereby causing transistor Q1115 to conduct. This in turn causes the emitter of transistor Q1103 to jump up to the 37½ volt level, raising the input voltage to transistor Q1101 to 37½ volts. Diode D1101 now operates to block off the 25 volt power source. As the output signal on line 1158 climbs toward 50 volts, the voltage at 1156 also climbs upwardly toward the 50 volt level. By the time the audio signal reaches the 50 volt level, the voltage at 1156 will also have reached 50 volts, thereby increasing the voltage supplied to collector 1110 of Q1101 to 50 volts.

The operation of the FIG. 10 circuit is identical to that of FIG. 11 up to this point. However, as the input signal voltage rises still further above 50 volts, transistor control 1130 operates to switch transistor Q1105 on, thus causing the potential appearing at emitter 1116 of Q1105 to be applied directly to the collector of transistor Q1101 through diode D1303. Due to the bias at 1156a at this time, the potential applied to the collector of Q1101 will be 67½ volts. This will have the effect of back biasing diode D1301 to cause voltage from source E3 to be applied directly to transistor Q1101 through transistor Q1105.

Figure 8:
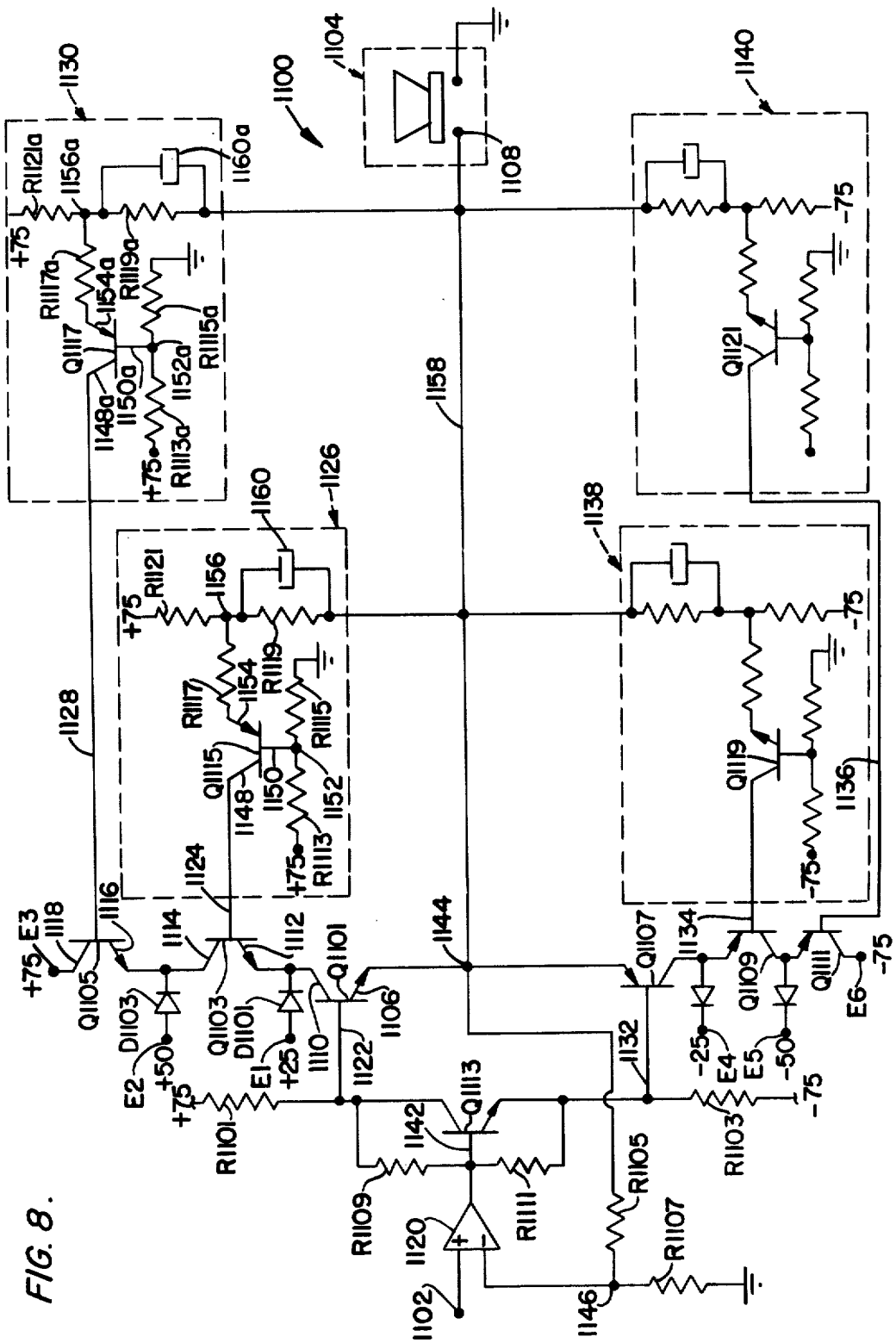
FIG. 8 is an alternative embodiment of a push-pull amplifier constructed in accordance with the present invention and adapted to receive stepped voltages from the power supply of the present invention.

FIG. 11 is a graph representing the operation of the circuit of FIG. 10, wherein line 1401 represents the output voltage on line 1158 of FIG. 8 and line 1402 represents the voltage applied to the collector 1110 of transistor Q1101.

Figure 12A:
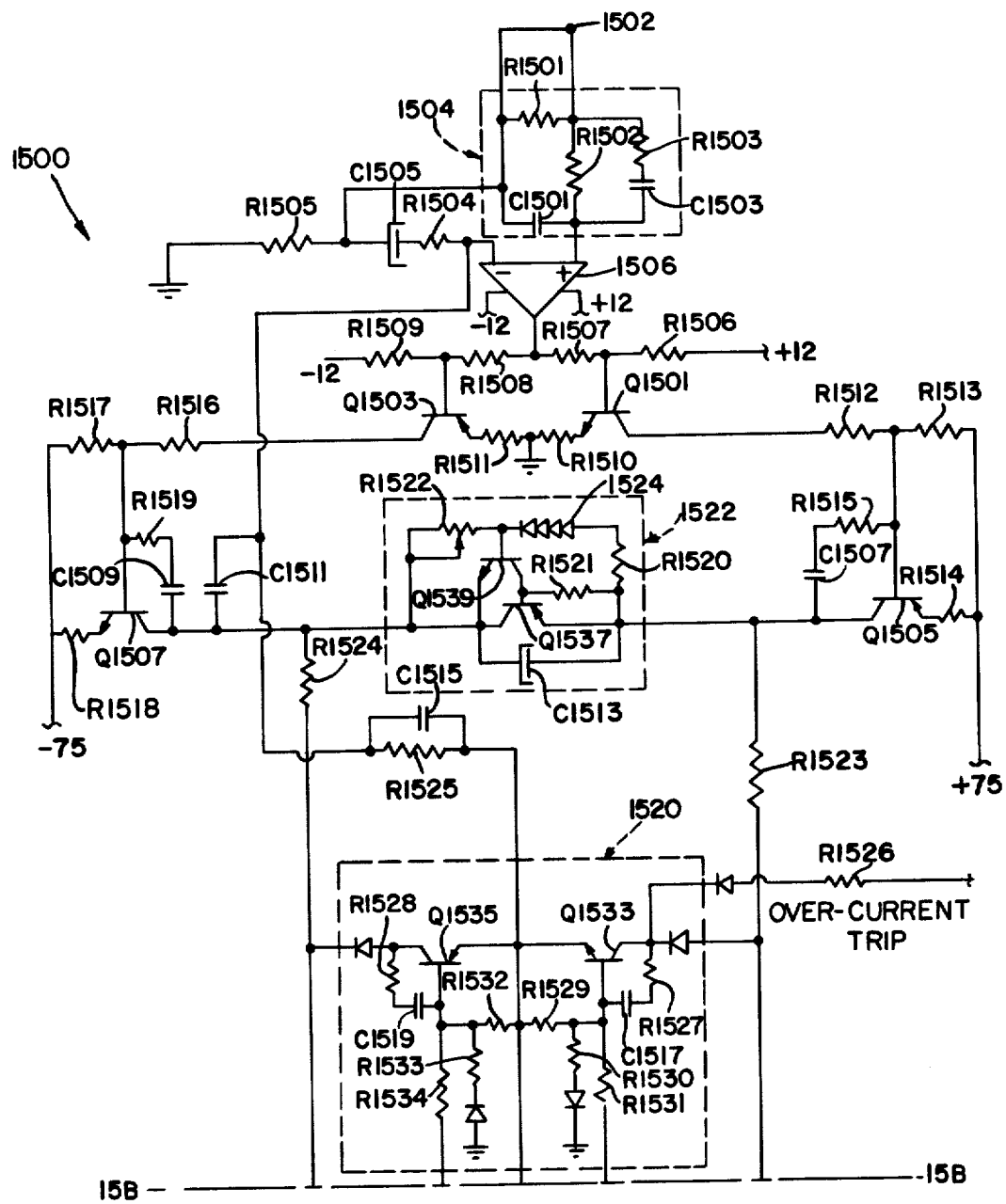
FIGS. 12A and 12B are circuit diagrams of a preferred embodiment of the left channel of an amplifier constructed in accordance with the present invention.
Figure 12B:
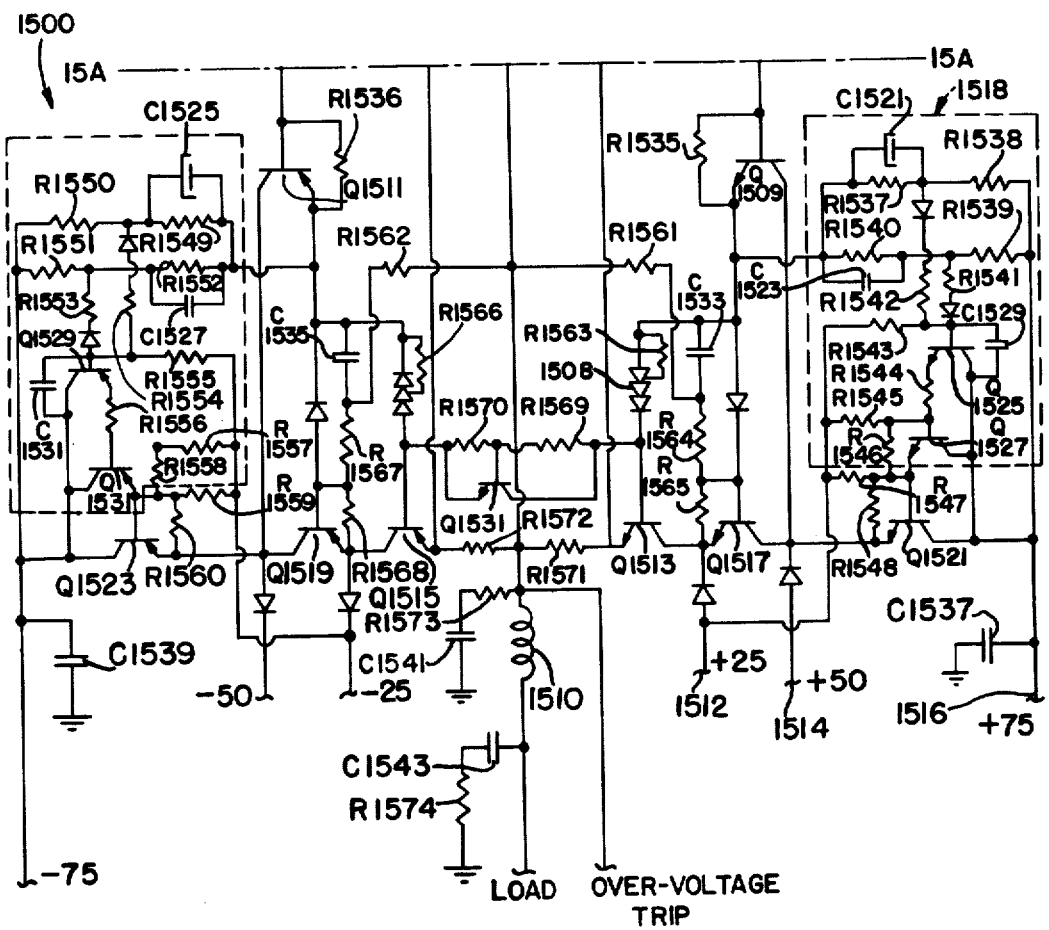
Figure 12C:
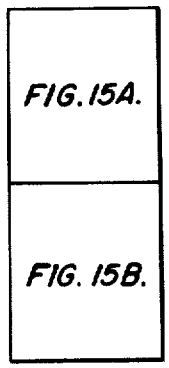

A preferred embodiment of the left and right channels of a stereo amplifier constructed in accordance with the present invention is illustrated in FIGS. 12A, 12B and 13. Referring first to the left channel circuitry 1500 illustrated in FIGS. 12A and 12B, a left channel input signal is received at terminal 1502 and preconditioned in a high frequency filter 1504 which rolls the audio signal off beyond 20 KHz. This filter acts to prevent transient inter-modulation distortion. Upon leaving filter 1504, the input signal enters operational amplifier 1506 and thereafter passes to transistors Q1501 and Q1503, which split the input signal into positive and negative halves. The positive half of the signal is fed to the upper half of the left channel amplifier and the negative half of the signal is fed to the lower half of the left channel amplifier. Because the upper and lower halves of the left channel amplifier are symmetrical, only the upper half will be described in detail.

The output of transistor Q1501 is level shifted upwardly through the action of resistors R1512 and R1513 to the base of transistor Q1505. The signal appearing at the output collector of transistor Q1505 is transmitted to transistor Q1509. At very low output power requirements, the emitter current from transistor Q1509 flows through series arranged diodes, indicated at 1508, to the base of output transistor Q1513, whereupon transistor Q1513 begins conducting. Current from 25 volt power source 1512 then passes through output transistor Q1513 to an output inductor 1510 and on into the loudspeaker.

When output voltages above approximately 25 volts are required, the amplifier output current is derived from the 50 volt power source 1514 through output transistor Q1517. Similarly, when output voltages above 50 volts are required, transistor Q1509 drives output transistor Q1521 to derive current from the 75 volt power source 1516. Switching circuit 1518, including transistors Q1525 and Q1527, acts to apportion the voltage drop across the power transistors Q1513, Q1517 and Q1521.

The left channel amplifier includes an overcurrent protection circuit 1520. In the event of a short circuit across the output transistors, heavy currents are drawn through the amplifier, thereby creating a voltage drop across the emitter resistor R1571 of output transistor Q1513. This voltage drop in turn switches over-current protection transistor Q1533 on, and the current which normally flows through transistor Q1505 to the base of transistor Q1509 is instead diverted to flow through the collector off over-current protection transistor Q1533. Thus deprived of its drive current, transistor Q1509 will not turn on and the output transistors will not conduct. Consequently, the high power dissipations otherwise occurring under short circuit conditions are prevented.

Cross-over distortion is minimized by the action of transistors Q1537 and Q1539 in cross-over prevention circuit 1522. Transistors Q1537 and Q1539, together with the 1-2-3-4 series arranged diodes 1524, resistors R1520 and R1521, and capacitor C1513, form a bias network which develops a slight forward voltage drop between the bases of transistor Q1509 in the upper half of the left channel amplifier and transistor Q1511 in the lower half of the amplifier. This forward voltage drop places transistors Q1509 and Q1511 on the verge of conducting. When an audio signal is received by the amplifier, Q1509 and Q1511 will conduct immediately and without discontinuity in the amplifier output waveform, thereby resulting in very low distortion of the audio signal.

For purposes of convenience, the values of all the capacitors and resistors employed in the circuit of FIGS. 12A and 12E are listed in Table II below.

FIG. 16 illustrates the input portion of the circuitry for the right channel amplifier. The right channel amplifier includes a network for shifting the phase of the incoming audio signal by 180° in order to better utilize the amplifier power supply. In all other respects, the right channel amplifier circuitry is identical to that of the left channel amplifier illustrated in FIGS. 15A and 15B.

Statistical analysis of stereo broadcasts indicates that the vast majority of audio signals associated with one channel of such broadcasts are in phase with the audio signals of the other channel. Prior art high fidelity amplifiers generally process incoming stereo signals without any modifications of the phase between the channels, operating in what is known as single ended fashion. The components of a stereo amplifier operating in single ended fashion, however, tend to drain additional energy from the power supply. When the amplifier output voltage is high, the positive side of the power supply furnishes power to both channels but the negative side of the power supply does no work. When the amplifier output voltage is low, the negative side of the power supply furnishes power to the amplifier but the positive side is not working.

Greater efficiency can be obtained from the amplifier if both sides of the power supply work continuously. In such situations, the power supply is said to be operated in bridge. Power can be delivered in the bridge mode to a two channel stereo amplifier by inverting the incoming signals in one of the amplifier channels and thereafter processing both channels in an out-of-phase fashion. As a result of the change in phase relationship between the otherwise generally in-phaSe stereo signals, positive power will always be required by one of the two amplifier channels while the remaining channel during any given power cycle will require negative power. Thus, regardless of the value of the amplifier output voltage, the positive and negative excursions of the power supply during each power cycle will both be employed. The greater power available at the amplifier output due to the fact that the power supply is being utilized more efficiently can increase the output power by about 15–20%.

Again referring to FIG. 13, the right channel amplifier is indicated generally at 1600. The audio input signal to the right channel is received at terminal 1601 and fed to inverting network 1602. The inverting network, which consists of capacitors C1601 and C1603 in combination with resistors R1601, R1603 and R1605, drives the inverting terminal of operational amplifier 1604. The values of the network components are listed in Table III below. Driving the inverting terminals of operational amplifier 1604 produces an output signal which is 180° out of phase with the input signal. As previously discussed, the majority of audio signals in each channel of a stereo broadcast are in phase. Consequently, the use of the inverting network generally results in a 180° phase difference between the operation of the left channel and the operation of the right channel of the amplifier.

Figure 14:
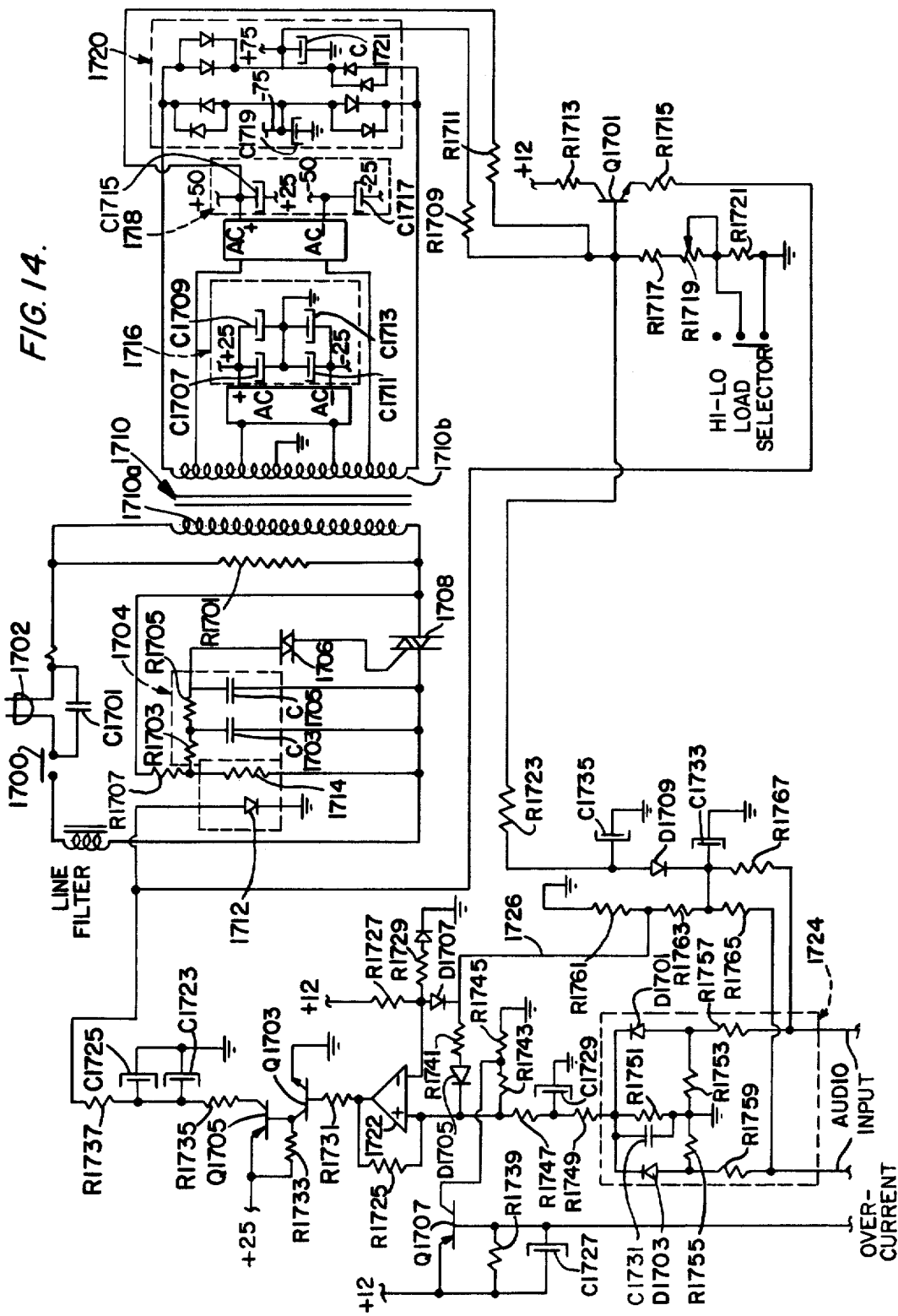
FIG. 14 is a circuit diagram of a power supply for the preferred embodiment of the present invention, wherein various safety control features have been incorporated into the circuit.

FIG. 14 is a preferred embodiment of the power source for the left and right channel amplifiers illustrated respectively in FIGS. 15A, 15B and 16. Referring now to FIG. 14, when switch 1700 is closed, current begins to flow from A.C. power line 1702 through a phase shift network 1704 to Diac 1706 and Triac 1708. Triac 1708 turns on, permitting curent flow through the primary 1710a of transformer 1710. The magnetic field in primary 1710a builds up, transferring energy to transformer secondary 1710b and then to electrolytic energy storage capacitor banks 1716, 1718 and 1720. Storage capacitor bank 1716 is designed to maintain a constant 25 volt output at the 25 volt power source, capacitor bank 1718 is designed to maintain a constant 50 volt output and the 50 volt power source, and capacitor bank 1720 is designed to maintain a constant 75 volt output at the 75 volt power source. The capacitors in the capacitor banks become fully charged within the first 100 milliseconds after the power supply is turned on.

When the voltages at the three power supplies respectively reach their preferred voltage levels of 25, 50 and 75 volts, control transistor Q1701 is forced into conduction and the emitter current from Q1701 flows through an LED diode 1712. In response to the emitter current, LED 1712 emits a red light which shines on photoresistor 1714 and lowers the photo-resistance value thereof. The lowering of the resistance value of photoresistor 1714 in turn acts to shunt some of the current flowing through phase shift network 1704, subsequently shifting the phase of the A.C. line signal and causing the Diac 1706 and Triac 1708 to fire at a later point on the incoming A.C. line sine wave.

Changes in the firing point of the Diac and Triac create variations in the conduction angles and corresponding variations in the amplifier output voltage. Such variations provide a means for tracking the audio signal whenever the audio signal frequency is below the repetition rate of the power supply line, e.g., below a frequency of 120 Hertz (2×60 Hertz). The incoming audio signal is summed at the junction of resistors R1765 and R1767, and is low passed by the time constant of the parallel combination of resistors R1765, R1767 and capacitor C1733. The resulting signal is then rectified by diode D1709 to form a D.C. voltage which is proportional to the output of the power amplifier. This proportional D.C. voltage is applied to capacitor C1735, from whence it is fed to control transistor Q1701. Control transistor Q1701 thereafter controls the operation of LED 1712 to vary the time constant of phase shift network 1704 as discussed above, generating greater amplifier output voltages under high signal conditions and lesser output voltages under lower signal conditions. The output of the power supply thus effectively tracks incoming audio signals having frequencies in the low audio range. This tracking ability makes it possible to further reduce the cost, size and weight of the amplifier unit.

Automatic shut down of the FIG. 14 power supply as a result of over-current conditions is achieved through the use of operational amplifier 1722 and transistors Q1703 and Q1705. If a fault condition results in over-current delivery to the audio amplifier, an over-current trip signal from the circuit of FIG. 15A is fed to the base of transistor Q1707. Transistor Q1707 switches on, causing the input port of operational amplifier 1722 to go high. The output of operational amplifier 1722 likewise goes high, switching transistors Q1703 and Q1705 on. The emitter of transistor Q1705 is connected to the 25 volt source and the collector of Q1705 is connected to capacitors C1723 and C1725. When transistor Q1705 turns on, the charge from the 25 volt supply is transferred to capacitors C1723 and C1725. Current then flows through LED 1712, causing the LED to shine brightly on photoresistor 1714. The resistance of photoresistor 1714 is accordingly lowered to a value sufficient to shunt virtually all of the current from the phase shift network 1704, thereby shutting the power supply down.

Whe the power supply is shut down, LED 1712 is maintained in a lighted condition by the charge stored on capacitors C1723 and C1725. After a short period of time (i.e., somewhere between ½ and 1 minute) the charge on capacitors C1723 and C1725 dissipates through the LED and the LED begins to go dark again. The resistance of photoresistor 1714 consequently begins to rise and the power supply cuts back on. If the fault condition has been removed, the power supply remains on and the audio amplifier operates as before. If, however, the fault still exists, the over-current trip line activates transistor Q1707 and the power shut-off sequence is repeated.

An over-voltage trip network is indicated at 1724. The audio signal from the output of the audio amplifier drives the network, including resistors R1751, R1753, R1755, R1757 and R1759, capacitor C1731, and diodes D1701 and D1703, to form a D.C. signal which represents the time-average half-way rectified audio signal. Note that diodes D1701 and D1703 serve as OR gates as well as rectifiers. The output at the junction of resistors R1751 and R1753 (e.g., the time-average audio voltage) charges capacitor C1731. Capacitor C1731 is chosen such that a value representative of a pre-selected over-voltage value will cause capacitor C1731 to trip operational amplifier 1722, thereafter turning on transistors Q1703 and Q1705 to shut down the power supply in a manner analogous to that which occurs during over-current conditions.

If for any reason (i.e., amplifier failure or the dropping of a tone arm) a D.C. component should appear at the amplifier output, a D.C. voltage will appear at the junction of resistors R1761 and R1763. This voltage is carried through D.C. fault trip line 1726 to operational amplifier 1722, causing the operational amplifier to trip. When the D.C. component is positive, diode D1705 will conduct into the positive port of operational amplifier 1722 and the operational amplifier will go high. When the D.C. component is negative, diode D1707 will conduct into the negative or inverting port of operational amplifier 1722 and the output of the operational amplifier will also go high. In both cases, the power supply will be shut down following the switching of transistors Q1703 and Q1705 and the energization of LED 1712.

Tables listing the values of the various resistors and capacitors illustrated in FIGS. 12A, 12B, 13 and 14 follow. As previously discussed, Table II contains listings for the circuitry of FIGS. 12A and 12B. Table III includes the components of the inverting network of FIG. 13, while Table IV discloses preferred values for the resistors and capacitors of FIG. 14.

TABLE II
VALUES OF THE RESISTORS AND CAPACITORS USED IN THE LEFT CHANNEL AMPLIFIER OF FIGS. 15A AND 15B

Resistors

| | | |
|---|---|---|
| R1501 - 15kΩ | R1526 - 39kΩ | R1551 - 22kΩ |
| R1502 - 2kΩ | R1527 - 100Ω | R1552 - 18kΩ |
| R1503 - 6.2kΩ | R1528 - 100Ω | R1553 - 4.7kΩ |
| R1504 - 390Ω | R1529 - 1kΩ | R1554 - 39Ω |
| R1505 - 2.7Ω | R1530 - 5.6kΩ | R1555 - 27kΩ |
| R1506 - 9.1kΩ | R1531 - 120Ω | R1556 - 4.7Ω |
| R1507 - 1.5kΩ | R1532 - 1kΩ | R1557 - 3.3kΩ |
| R1508 - 1.5kΩ | R1533 - 5.6kΩ | R1558 - 2.2kΩ |
| R1509 - 9.1kΩ | R1534 - 120Ω | R1559 - 3.3kΩ |
| R1510 - 1.5kΩ | R1535 - 1.5kΩ | R1560 - 33Ω |
| R1511 - 1.5kΩ | R1536 - 1.5kΩ | R1561 - 2.7kΩ |
| R1512 - 4.7kΩ | R1537 - 2.4kΩ | R1562 - 2.7kΩ |
| R1513 - 910Ω | R1538 - 22kΩ | R1563 - 10kΩ |
| R1514 - 47Ω | R1539 - 22kΩ | R1564 - 220Ω |
| R1515 - 1kΩ | R1540 - 18kΩ | R1565 - 220Ω |
| R1516 - 4.7kΩ | R1541 - 4.7kΩ | R1566 - 6.2Ω |
| R1517 - 910Ω | R1542 - 39Ω | R1567 - 220Ω |
| R1518 - 47Ω | R1543 - 27kΩ | R1568 - 220Ω |
| R1519 - 1kΩ | R1544 - 4.7kΩ | R1569 - 56Ω |
| R1520 - 12kΩ | R1545 - 3.3kΩ | R1570 - 62Ω |
| R1521 - 5.6kΩ | R1546 - 2.2kΩ | R1571 - .1Ω |
| R1522 - 5kΩ | R1547 - 3.3kΩ | R1572 - .1Ω |
| R1523 - 10Ω | R1548 - 33Ω | R1573 - 2.7Ω |
| R1524 - 10Ω | R1549 - 2.4kΩ | R1574 - 2.7Ω |
| R1525 - 12kΩ | R1550 - 22kΩ | |

Capacitors

| | | |
|---|---|---|
| C1501 - 200 pf | C1517 - .01 f | C1531 - 180 pf |
| C1503 - .001 f | C1519 - .01 f | C1533 - .039 f |
| C1505 - 470 uf | C1521 - 22 uf | C1535 - .039 f |
| C1507 - 100 pf | C1523 - .0033 f | C1537 - .1 f |
| C1509 - 100 pf | C1525 - 22 uf | C1539 - .1 f |
| C1511 - 200 pf | C1527 - .0033 f | C1541 - .33 f |
| C1513 - 4.7 uf | C1529 - 180 pf | C1543 - .33 f |
| C1515 - 10 pf | | |

TABLE III
VALUES OF THE RESISTORS AND CAPACITORS USED IN THE INVERTING NETWORK OF THE RIGHT CHANNEL AMPLIFIER OF FIG. 16

| Resistors | Capacitors |
|---|---|
| R1601 - 3kΩ | C1601 - 200 pf |
| R1603 - 12kΩ | C1603 - 33 pf |
| R1605 - 15kΩ | |

TABLE IV
VALUES OF THE RESISTORS AND CAPACITORS USED IN THE POWER SUPPLY OF FIG. 17

Resistors

| | | |
|---|---|---|
| R1701 - 1.2kΩ | R1725 - 9.1 megΩ | R1747 - 2 megΩ |
| R1703 - 150kΩ | R1727 - 510kΩ | R1749 - 1.6 megΩ |
| R1705 - 180kΩ | R1729 - 5.6kΩ | R1751 - 199kΩ |
| R1707 - 27kΩ | R1731 - 6.8kΩ | R1753 - 3.3kΩ |
| R1709 - 27kΩ | R1733 - 22kΩ | R1755 - 3.3kΩ |
| R1711 - 150kΩ | R1735 - 1Ω | R1757 - 4.7kΩ |
| R1713 - 1.5kΩ | R1737 - 3.6kΩ | R1759 - 4.7kΩ |

TABLE IV-continued
VALUES OF THE RESISTORS AND CAPACITORS USED IN THE POWER SUPPLY OF FIG. 17

| | | |
|---|---|---|
| R1715 - 390Ω | R1739 - 20kΩ | R1761 - 3.3kΩ |
| R1717 - 680Ω | R1741 - 100kΩ | R1763 - 6.8kΩ |
| R1719 - 200Ω | R1743 - 200kΩ | R1765 - 30kΩ |
| R1721 - 680Ω | R1745 - 20kΩ | R1767 - 60kΩ |
| R1723 - 10kΩ | | |

Capacitors

| | | |
|---|---|---|
| C1701 - .1f | C1713 - 200uf | C1725 - 2200uf |
| C1703 - .013f | C1715 - 2200uf | C1727 - 22uf |
| C1705 - .01f | C1717 - 2200uf | C1729 - 47uf |
| C1707 - 2200uf | C1719 - 3000uf | C1731 - .033f |
| C1709 - 2200uf | C1721 - 3000uf | C1733 - 2.2uf |
| C1711 - 2200uf | C1723 - 2200uf | C1735 - 2.2uf |

INDUSTRIAL APPLICABILITY

The above disclosed amplifier circuitry and methods are of particular economic importance in the field of audio amplifiers. The concepts disclosed herein permit dramatic reduction in the weight and cost of providing suitable power supplies and power transistors for high fidelity audio amplifiers and are particularly well adapted to stereophonic systems.

As an example of the dramatic weight reductions possible through implementation of the concepts of this invention, a completed commercial embodiment of a power supply and amplifier rated at 400 watts weighs only 4 kg. In contrast, the lightest prior art commercial amplifier of comparable power rating weighs approximately 16 kg.

I claim:

1. An apparatus for amplifying an audio signal having an amplitude which varies at an audio frequency, said apparatus comprising
   (a) audio amplifier means for amplifying the audio frequency amplitude variations of the audio signal to produce an output signal corresponding to the audio signal, said amplifier means including an audio signal receiving means for receiving the audio signal and a power receiving means for receiving electrical energy for producing the output signal;
   (b) power supply means for supplying power to said amplifier means, said power supply means adapted to be connected with a source of commercially available, sinusoidally varying supply voltage having a constant frequency within the audio range, a transformer having a primary winding and a secondary winding, said secondary winding being operatively connected to said power receiving means of said amplifier means, said primary winding being adapted to be connected to said source;
   (c) power control means to cause variable amounts of electrical energy to be transmitted to the primary winding of the transformer to induce corresponding variable electrical energy in said secondary winding, said power control means including switch means connected between said source and said primary winding for operating in a conductive state in response to a control signal for a selected portion of each cycle of said sinusoidally varying supply voltage to cause said selected portion of said sinusoidally varying supply voltage to be applied across said primary winding only when said switch means is in said conductive state; and
   (d) control signal generating means responsive to the time varying amplitude of the audio signal to generate said control signal for said power control means to control the period of conduction of said switch means during each cycle of said sinusoidally varying supply voltage in correspondence with the time varying amplitude of the audio signal to minimize the time portion of each cycle of sinusoidally varying supply voltage during which idling currents pass through said primary winding.

2. Apparatus as defined in claim 1, wherein said switch means include a solid state switch connected between said source and said primary winding, said solid state switch being responsive to said control signal to become conductive, said control signal generating means supplying variable control signals to said solid state switch at variable times during each cycle of said sinusoidally varying supply voltage to cause said solid state switch to begin conduction at varying times dependent upon the time varying amplitude of the audio signal.

3. Apparatus as defined in claim 2, wherein said power control means further includes means responsive to a cut off control signal for cutting off flow of current to said primary winding, said control signal generating means including means for producing a cut off control signal in a manner to permit sufficient current to flow through said primary winding to allow power of a magnitude which varies over time in relationship to the time varying characteristics of the audio signal while simultaneously minimizing the flow of idling currents through said primary winding.

4. Apparatus as defined in claim 2, wherein said control signal generating means includes a control link for transmitting an electrical signal representative of the voltage level produced by said secondary winding to said power control means for causing the control signal to respond to variations in the output voltage produced by said power supply means.

5. Apparatus as defined in claim 4, wherein said control link includes an electro-optical link for preventing transfer of substantial electrical energy between said primary and second windings over said control link.

6. Apparatus as defined in claim 2, further including fault condition sensing means for sensing faulty operation of said audio amplifier means to produce a fault signal, said control signal generating means including fault response means connected with said fault condition sensing means to cause said variable control signal to reduce the conductive duty cycle of said solid state switch.

7. Apparatus as defined in claim 1, further including audio signal filter means for generating an audio tracking signal representative of low frequency variations in the audio signal, said control signal generating means including audio signal responsive means to cause said power control means to modulate the power of pulses transferred to said primary winding in response to low frequency variations in the amplitude of the audio signal.

8. Apparatus as defined in claim 1, wherein said audio amplifier means includes first and second transistors having series connected emitter-collector circuits, said first transistor having a base electrode arranged to receive the audio signal and an emitter arranged to produce at least a portion of the output signal of said audio amplifier means, and wherein said power supply means includes first voltage means for providing a source of voltage at a first level to the connection between said first and second transistor and second voltage means for providing a source of voltage at a second level higher than said first level to the emitter-collector circuit of said second transistor; and transistor control means for holding said second transistor in a non-conductive state when the amplitude of said audio signal is below a first predetermined level and for causing said second transistor to conduct when the amplitude of said audio signal is above said first predetermined level.

9. Apparatus as defined in claim 8, wherein said transistor control means causes said first predetermined level to be equal to said first level and wherein said transistor control means further causes said first and second transistors to substantially equally bear the total voltage drop across said first and second transistors when the amplitude of said audio signal is above said predetermined level.

10. Apparatus as defined in claim 8, wherein said power supply means includes a third voltage means for providing a source of voltage at a third level higher than said second level and wherein said audio amplifier means includes a third transistor having an emitter connected with said first and second transistors, and a collector connected with said third voltage means and further including second transistor control means connected with the base of said third transistor for holding said third transistor in a non-conductive state when the amplitude of said audio signal is below a second predetermined level which is above said first predetermined level and for controlling the amplification of said third transistor to cause said first and third transistors to each bear a substantial portion of the total voltage drop across said first and third transistors when the amplitude of said audio signal is above said second predetermined level.

11. Apparatus as defined in claim 10, wherein the emitter of said third transistor is connected to the collector of said first transistor and wherein said audio amplifier means includes a diode connected between said first and second transistors to isolate said second transistor from said first transistor when said third transistor is conductive.

12. Apparatus as defined in claim 10, wherein the emitter of said third transistor is connected to the collector of said second transistor and said first and second transistor control means operates to cause said first, second and third transistors to equally share the voltage drop thereacross when said third transistor is conductive and wherein said audio amplifier means includes a pair of diodes between the collectors of said first and second transistors and said first and second voltage means, respectively, said diodes being arranged to isolate said first and second voltage sources when said third transistor is conductive.

13. Apparatus as recited in claim 1, wherein said control signal generating means causes said switch means to be conductive during a latter portion of each voltage half cycle from the source of sinusoidally varying supply voltage.

14. Apparatus as recited in claim 13, further including rectifying means operatively connected with the source of sinusoidally varying supply voltage and the primary winding to cause only positive current pulses to be directed to said primary winding, said switch means comprising voltage responsive switch means which becomes conductive at a predetermined voltage level of said supply voltage.

15. Apparatus as recited in claim 14, wherein said switch means comprises a silicon controlled rectifier connected in series between said power input terminal means and the primary winding of the transformer.

16. Apparatus as recited in claim 13, wherein said source of sinusoidally varying supply voltage is connected to the primary winding to cause alternating current to be delivered to said primary winding, said switch means being voltage responsive switch means to cause the switch means to be conductive at predetermined voltage levels during latter portions of each half cycle of said supply voltage.

17. Apparatus as recited in claim 16, wherein said switch means comprises a triac connected in series with said primary winding.

18. Apparatus as defined in claim 1, wherein said transformer has a secondary to primary turns ratio of below 1.0 with a primary inductance above 30 microhenries and a coil wire gauge diameter above no. 18.

19. Apparatus as defined in claim 1 wherein said audio signal includes first and second stereophonic signals in which the amplitude excursions tend to be in phase, and wherein said power supply means includes first voltage supply means connected with said secondary winding for supplying a voltage having one polarity and a second voltage supply means for supplying a voltage having a polarity opposite of the voltage supplied by said first voltage supply means, and wherein said audio amplifier means includes
  (a) a first channel amplifying means for amplifying the first stereophonic signal, said first amplifying means including a Class B amplifier connected with said first and second voltage supply means for drawing power from said first voltage supply means when the amplitude excursions of the first stereophonic signal is of one polarity and for drawing power from said second voltage supply means when the amplitude excursions of the first stereophonic signal is of a second polarity;
  (b) a second channel amplifying means for amplifying the second stereophonic signal, said second amplifying means including a Class B amplifier connected with said first and second voltage supply means for drawing power from said first voltage supply means when the amplitude excursions of the second stereophonic signal is of one polarity and for drawing power from said second voltage supply means when the amplitude excursions of the second stereophonic signal is of a second polarity;
  (c) polarity inversion means for inverting the polarity of one of the stereophonic signals to decrease the amount of time during which said first and second amplifying means draw power simultaneously from said first and second voltage supply means when said stereophonic signals are being simultaneously amplified.

20. Apparatus as defined in claim 1, wherein said power supply means includes charge storage means connected with said secondary winding and said power receiving means of said amplifier for storing electrical energy generated in said secondary winding and further wherein said control signal generating means includes a feedback means connected to said charge storage means and said control signal generating means for causing the charge potential stored in said charge storage means to be held substantially constant by varying the period of conduction of said switch means during each cycle of said sinusoidally varying supply voltage.

* * * * *